(12) United States Patent
Fukutomi et al.

(10) Patent No.: US 8,985,937 B2
(45) Date of Patent: Mar. 24, 2015

(54) STOCKER APPARATUS AND SUBSTRATE TREATING APPARATUS

(75) Inventors: Yoshiteru Fukutomi, Shiga (JP); Hideyuki Iwata, Chiba (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 0 days.

(21) Appl. No.: 13/270,695

(22) Filed: Oct. 11, 2011

(65) Prior Publication Data

US 2012/0034062 A1    Feb. 9, 2012

Related U.S. Application Data

(62) Division of application No. 12/693,825, filed on Jan. 26, 2010, now abandoned.

(30) Foreign Application Priority Data

Jan. 26, 2009  (JP) ................. 2009-014131

(51) Int. Cl.
*H01L 21/677* (2006.01)

(52) U.S. Cl.
CPC .... *H01L 21/67775* (2013.01); *H01L 21/67766* (2013.01); *H01L 21/67769* (2013.01); *Y10S 414/14* (2013.01)
USPC .......................................... 414/805; 414/940

(58) Field of Classification Search
USPC .................... 414/217, 411, 940, 805
See application file for complete search history.

(56) References Cited

U.S. PATENT DOCUMENTS

| | | | |
|---|---|---|---|
| 5,964,561 | A | 10/1999 | Marohl |
| 6,009,890 | A | 1/2000 | Kaneko et al. |
| 6,079,927 | A | 6/2000 | Muka |
| 6,506,009 | B1 | 1/2003 | Nulman et al. |
| 6,726,429 | B2 | 4/2004 | Sackett et al. |
| 6,848,882 | B2 | 2/2005 | Chen et al. |
| 2005/0036856 | A1 | 2/2005 | Yamashita |
| 2008/0056860 | A1 | 3/2008 | Natume |
| 2008/0170932 | A1 | 7/2008 | Yamamoto |
| 2008/0217278 | A1 | 9/2008 | Murata |
| 2009/0003825 | A1 | 1/2009 | Ueda et al. |
| 2009/0081009 | A1 | 3/2009 | Yamamoto et al. |
| 2010/0191362 | A1 | 7/2010 | Tsukinoki |

FOREIGN PATENT DOCUMENTS

| | | |
|---|---|---|
| JP | 10-223728 | 8/1998 |
| JP | 2000-12431 | 4/2000 |
| JP | 2000-95306 | 4/2000 |
| JP | 2001-298069 | 10/2001 |

(Continued)

*Primary Examiner* — Jonathan Snelting
(74) *Attorney, Agent, or Firm* — Ostrolenk Faber LLP

(57) ABSTRACT

A stocker apparatus and method have openers for receiving FOUPs acting as containers each for storing a plurality of substrates, to feed and collect the substrates to/from a substrate treating apparatus main body, a transport mechanism for holding and transporting the FOUPs, and racks arranged above the openers for receiving the FOUPs. The racks include an incoming rack for receiving the FOUPs from an external transport device, an outgoing rack for delivering the FOUPs to the external transport device, and a mid-treatment storage rack for keeping an empty FOUP after the substrates are fed therefrom. The openers include a feed-only opener for feeding the substrates, and a collect-only opener for collecting the substrates.

19 Claims, 23 Drawing Sheets

(56) References Cited

FOREIGN PATENT DOCUMENTS

| | | |
|---|---|---|
| JP | 2002-134588 | 5/2002 |
| JP | 2005-150129 | 6/2005 |
| JP | 2005-150495 | 6/2005 |
| JP | 2008-172062 | 7/2008 |
| JP | 2009-10287 | 1/2009 |
| JP | 2009-94460 | 4/2009 |
| JP | 2010-171276 | 8/2010 |

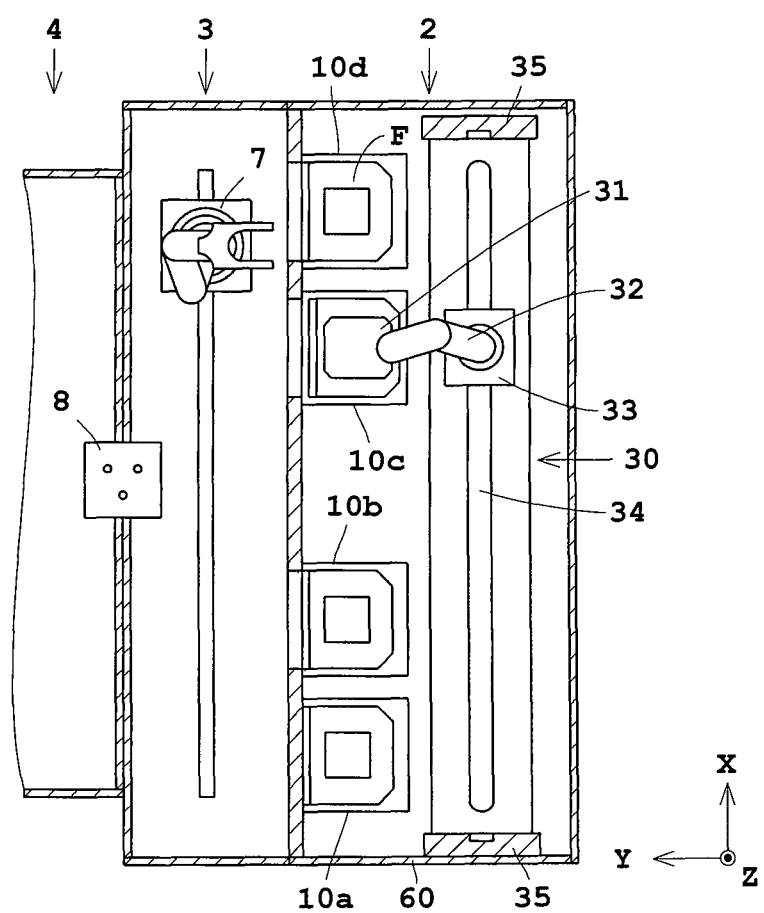

STOCKER APPARATUS AND SUBSTRATE TREATING APPARATUS

CROSS REFERENCE TO RELATED APPLICATIONS

The present application is a divisional application of U.S. Ser. No. 12/693,825 filed Jan. 26, 2010, which application claims benefit and priority of Japanese Application No. 2009-014131 filed Jan. 26, 2009 which are all incorporated herein in their entirety.

BACKGROUND OF THE INVENTION (1) Field of the Invention

This invention relates to a stocker apparatus and a substrate treating apparatus for storing substrates such as semiconductor wafers, glass substrates for photo resist, glass substrates for liquid crystal displays, or substrates for optical disks (hereinafter called simply "substrates").

(2) Description of the Related Art

A conventional substrate treating apparatus of the single substrate type, as shown in FIG. 1, includes an indexer mechanism 100, four openers 101a-101d and treating units (not shown). The openers 101a, 101b, 101c, ..., when not distinguished, will be referred to as "opener(s) 101".

Each opener 101 receives, on a support table, a FOUP (Front Opening Unified Pod) F which is a container storing a plurality of substrates in multiple stages in a substantially horizontal state, and opens and closes a lid of the FOUP F. When the lid of the FOUP F is opened by the opener 101, the indexer mechanism 100 transports the substrates from the FOUP F to treating units.

In recent years, the substrate treating apparatus has been constructed to include an increased number of treating units which are stacked in multiple layers, to improve throughput of the substrate treating apparatus. The number of openers 101 installed has also been increased correspondingly. However, as shown in FIG. 2, the openers 101 simply juxtaposed in one row will increase the width of the substrate treating apparatus in the direction of X-axis in which the openers 101 are juxtaposed. This enlarges an installation area of the substrate treating apparatus.

Then, the following technique has been proposed (e.g. in Japanese Unexamined Patent Publication No. 2000-124301).

This substrate treating apparatus includes a cassette table for receiving carrier cassettes each storing a plurality of substrates, and an auxiliary arm for loading and unloading the substrates into/from the carrier cassettes. Between the cassette table and auxiliary arm, a container is provided for storing the carrier cassettes in two, upper and lower stages. This container is movable up and down.

A carrier cassette placed on the cassette table is first transported to one of the two stages of the container. The auxiliary arm takes the substrates out of the carrier cassette transported into the container. When all the substrates have been taken out, the carrier cassette now empty is displaced by vertical movement of the container.

By vertical movement of the container, a next carrier cassette placed on the cassette table and storing substrates to be treated can be transported to the other stage of the container. Subsequently, the auxiliary arm can take the substrates out of the carrier cassette transported to the other stage of the container.

Such construction including the container and cassette table can store (keep) two carrier cassettes in the container. Where, for example, four of this construction are juxtaposed, a maximum of eight carrier cassettes can be stored. Therefore, enlargement of the apparatus can be inhibited while being capable of receiving an increased number of carrier cassettes.

A FOUP station (stocker apparatus) has been disclosed as an apparatus similar to the above and capable of receiving many FOUPs (e.g. Japanese Unexamined Patent Publication No. 2005-150495).

In this apparatus, a mechanism for transporting FOUPs F can feed many substrates to a substrate treating apparatus by transporting a FOUP F made empty of substrates to a different location, and transporting another FOUP F storing substrates to be treated to a transfer position to feed the substrates from this FOUP F.

The conventional apparatus with such a construction has the following drawback.

The substrates having received a predetermined treatment cannot be collected unless the mechanism for transporting FOUPs F puts an empty FOUP F on standby on an opener beforehand for substrate collection. When, for example, a delay occurs in transporting the empty FOUP for use in collecting substrates, a resulting standby time will impair efficient collection. A smooth operation is difficult without rules determined beforehand for transporting empty FOUPs F and collecting treated substrates.

SUMMARY OF THE INVENTION

This invention has been made having regard to the state of the art noted above, and its object is to provide a stocker apparatus and a substrate treating apparatus capable of feeding and collecting substrates efficiently while inhibiting enlargement of the apparatus.

The above object is fulfilled, according to this invention, by a stocker apparatus connected to a single substrate type substrate treating apparatus main body, comprising openers for receiving FOUPs acting as containers each for storing a plurality of substrates, to feed and collect the substrates to/from the substrate treating apparatus main body; a transport mechanism for holding and transporting the FOUPs; a control device for controlling at least FOUP transport; and racks arranged above the openers for receiving the FOUPs, and including an incoming rack for receiving the FOUPs from an external transport device; an outgoing rack for delivering the FOUPs to the external transport device; and a mid-treatment storage rack for keeping an empty FOUP after the substrates are fed therefrom; the openers including a feed-only opener for feeding the substrates, and a collect-only opener for collecting the substrates.

According to this invention, the openers for receiving FOUPs to feed and collect the substrates include a feed-only opener and a collect-only opener for separate uses. The feed-only opener is used only for feeding substrates from inside each FOUP, while the collect-only opener is used only for collecting the substrates into each FOUP. The transport mechanism transports an empty FOUP after the substrates are fed therefrom, from the feed-only opener to the collect-only opener, and then places a next FOUP storing substrates to be treated on the feed-only opener. This enables a continued operation to feed the substrates from the FOUPs. The collect-only opener receives the empty FOUP to collect treated substrates successively. After the treated substrates have been collected, the transport mechanism transports the FOUP storing the treated substrates from the collect-only opener to the outgoing rack, and places a next empty FOUP on the collect-only opener. This enables a continued operation to collect the substrates into the FOUPs. That is, the feed-only opener and collect-only opener are used to feed and collect substrates in succession, thereby realizing efficient feeding and collection of the substrates.

With the mid-treatment storage rack provided, when an empty FOUP after the substrates are fed therefrom is transported from the feed-only opener to the collect-only opener, but the empty FOUP cannot be transported to the collect-only opener because of presence thereon of a different FOUP, the empty FOUP can be transported to the mid-treatment storage rack. This allows a next FOUP storing substrates to be treated, to be placed on the feed-only opener, and therefore the substrates can continue to be fed from this FOUP. That is, since a FOUP can be transported to the mid-treatment storage rack even when the FOUP cannot be transported from the feed-only opener to the collect-only opener, substrates can be fed and collected continually without interruption.

An empty FOUP after the substrates are fed therefrom can be kept on the mid-treatment storage rack. Since it is not necessary to increase the number of openers, as is necessary with a conventional apparatus, the width of the apparatus can be maintained.

Further, the racks include, for separate uses, an incoming rack for receiving the FOUPs from an external transport device, and an outgoing rack for delivering the FOUPs to the external transport device. This allows the FOUPs to be transferred to and from the external transport device efficiently.

The above construction can feed and collect the substrates efficiently, and can inhibit enlargement of the apparatus compared with the conventional apparatus constructed by increasing the openers in one row.

In the above invention, it is preferred that the control device is arranged, when the empty FOUP after the substrates are fed therefrom is unable to be transported to the collect-only opener because of a different FOUP present on the collect-only opener, to cause the empty FOUP to be transported to the mid-treatment storage rack. When the empty FOUP after the substrates are fed therefrom is transported from the feed-only opener to the collect-only opener, but the FOUP cannot be placed on the collect-only opener because of presence thereon of a different FOUP, the control device causes the empty FOUP to be transported to the mid-treatment storage rack. This allows a next FOUP storing substrates to be treated, to be placed on the feed-only opener from which the empty FOUP has been transported, and therefore the substrates can continue to be fed from the next FOUP.

In the above invention, it is preferred that the racks further include a pre-treatment storage rack for keeping a FOUP storing substrates to be treated. With the pre-treatment storage rack provided, when a FOUP storing substrates to be treated is transported from the incoming rack to the feed-only opener, but the FOUP cannot be transported to the feed-only opener because of presence thereon of a different FOUP, the new FOUP can be kept on the pre-treatment storage rack. This allows a next FOUP storing substrates to be treated, to be placed on the incoming rack. An increased number of FOUPs storing substrates to be treated can be kept in the apparatus.

In the above invention, it is preferred that the racks further include a post-treatment storage rack for keeping a FOUP storing treated substrates. With the post-treatment storage rack provided, when a FOUP storing treated substrates is transported from the collect-only opener to the outgoing rack, but the FOUP cannot be transported to the outgoing rack because of presence thereon of a different FOUP, the FOUP storing treated substrates can be kept on the post-treatment storage rack. This allows a next empty FOUP to be placed on the collect-only opener. An increased number of FOUPs storing treated substrates can be kept in the apparatus.

In the above invention, it is preferred that the control device is arranged, when a FOUP placed on the incoming rack is unable to be transported to the feed-only opener because of a different FOUP present on the feed-only opener, to cause the FOUP placed on the incoming rack to be transported to the pre-treatment storage rack. When a FOUP placed on the incoming rack and storing substrates to be treated cannot be transported to the feed-only opener because of a different FOUP present on the feed-only opener, the control device causes this new FOUP to be transported to the pre-treatment storage rack. This allows the external transport device to transport a next FOUP storing substrates to be treated to the incoming rack from which the preceding FOUP has been transported.

In the above invention, it is preferred that the control device is arranged, when a FOUP having collected the substrates is unable to be transported to the outgoing rack because of a different FOUP present on the outgoing rack, to cause the FOUP having collected the substrates to be transported to the post-treatment storage rack. When a FOUP having collected the substrates is unable to be transported to the outgoing rack because of a different FOUP present on the outgoing rack, the control device causes the FOUP having collected the substrates to be transported to the post-treatment storage rack. This allows a next empty FOUP to be transported to the collect-only opener from which the preceding FOUP has been transported, whereby the substrates continue to be collected in the FOUPs.

In the above invention, it is preferred that each of the racks has a mechanism for opening and closing horizontally right and left, the mechanism in an open state allowing a FOUP to move vertically. Each rack having the mechanism for opening and closing horizontally right and left, when opened, permits vertical movement of a FOUP, and when closed, can hold the FOUP. This can reduce the size in the longitudinal direction of the stocker apparatus, thereby to inhibit enlargement of the apparatus.

In the above invention, it is preferred that the transport mechanism is movable horizontally and vertically as opposed to the openers and the racks, and is arranged to rotate about a vertical axis after drawing near a FOUP to be transported, thereby supporting the FOUP in a position directly above a horizontal transport path, and to move horizontally and vertically in this state to transport the FOUP to a predetermined position. The transport mechanism is movable horizontally and vertically as opposed to the openers and the racks, and is arranged to rotate about a vertical axis after drawing near a FOUP to be transported, thereby supporting the FOUP in a position directly above a horizontal transport path, and to move horizontally and vertically in this state to transport the FOUP to a predetermined position. This can reduce the size in the longitudinal direction of the stocker apparatus, thereby to inhibit enlargement of the apparatus.

In another aspect of the invention, a substrate treating apparatus comprises a single substrate type substrate treating apparatus main body for performing a predetermined treatment of substrates; and a stocker apparatus connected to the substrate treating apparatus main body; the stocker apparatus including openers for receiving FOUPs acting as containers each for storing a plurality of substrates, to feed and collect the substrates to/from the substrate treating apparatus main body; a transport mechanism for holding and transporting the FOUPs; a control device for controlling at least FOUP transport; and racks arranged above the openers for receiving the FOUPs, and including an incoming rack for receiving the FOUPs from an external transport device; an outgoing rack for delivering the FOUPs to the external transport device; and a mid-treatment storage rack for keeping an empty FOUP after the substrates are fed therefrom; the openers including a feed-only opener for feeding the substrates, and a collect-only opener for collecting the substrates.

According to this invention, the stocker apparatus is provided which includes openers for receiving FOUPs to feed and collect substrates, racks for receiving the FOUPs, and a transport mechanism capable of transporting the FOUPs. This construction can inhibit enlargement of the apparatus compared with the conventional apparatus constructed by increasing the openers in one row.

The openers of the stocker apparatus include a feed-only opener and a collect-only opener for separate uses. The feed-only opener is used only for feeding substrates from inside each FOUP, while the collect-only opener is used only for collecting substrates into each FOUP. An empty FOUP after the substrates are fed therefrom is transported from the feed-only opener to the collect-only opener, and then the feed-only opener receives a next FOUP storing substrates to be treated. This enables a continued operation to feed the substrates from the FOUPs. The collect-only opener receives the empty FOUP to collect treated substrates successively. After the treated substrates have been collected, the FOUP storing the treated substrates is transported to the outgoing rack, whereby a next empty FOUP can be placed on the collect-only opener. This enables a continued operation to collect the substrates into the FOUP. That is, the substrates can be fed and collected in succession, thereby realizing efficient feeding and collection of the substrates.

With the mid-treatment storage rack provided, when an empty FOUP after the substrates are fed therefrom is transported from the feed-only opener to the collect-only opener, but the empty FOUP cannot be transported to the collect-only opener because of presence thereon of a different FOUP, the empty FOUP can be transported to the mid-treatment storage rack. This allows a next FOUP storing substrates to be treated, to be placed on the feed-only opener, and therefore the substrates can continue to be fed from this FOUP. That is, since a FOUP can be transported to the mid-treatment storage rack even when the FOUP cannot be transported to the collect-only opener, substrates can be fed and collected continually without interruption.

Further, an incoming rack for receiving the FOUPs from an external transport device, and an outgoing rack for delivering the FOUPs to the external transport device, are provided for separate uses. This allows the FOUPs to be transferred to and from the external transport device efficiently.

Thus, the substrates can be fed and collected efficiently, and enlargement of the apparatus can be inhibited compared with the conventional apparatus constructed by increasing the openers in one row.

In the above invention, it is preferred that the control device is arranged to control the transport mechanism to execute a first transport step for transporting a FOUP placed on the incoming rack to the feed-only opener; a second-A transport step for transporting the FOUP placed on the feed-only opener and made empty of the substrates to the collect-only opener; a second-B transport step for once transporting the FOUP placed on the feed-only opener and made empty of the substrates to the mid-treatment storage rack to be kept thereon, and transporting the FOUP in keeping to the collect-only opener; and a third transport step for transporting the FOUP placed on the collect-only opener and having collected the substrates to the outgoing rack. The control device controls the transport mechanism to transport a FOUP placed on the incoming rack to the feed-only opener. The substrates are fed from the FOUP transported to the feed-only opener, and after the substrates are fed, the empty FOUP is transported to the collect-only opener. When the empty FOUP cannot be transported to the collect-only opener because of a different FOUP present thereon, the empty FOUP is once transported to the mid-treatment storage rack to be kept thereon, and is thereafter transported to the collect-only opener. Treated substrates are collected successively into the FOUP placed on the collect-only opener. After the substrates have been collected, the FOUP is transported from the collect-only opener to the outgoing rack. In this way, the substrates can be fed and collected efficiently.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 28 is a cross section of the stocker apparatus according to modification (5).

DESCRIPTION OF THE PREFERRED EMBODIMENTS

A preferred embodiment of this invention will be described in detail hereinafter with reference to the drawings.

Embodiment

Figure 1:
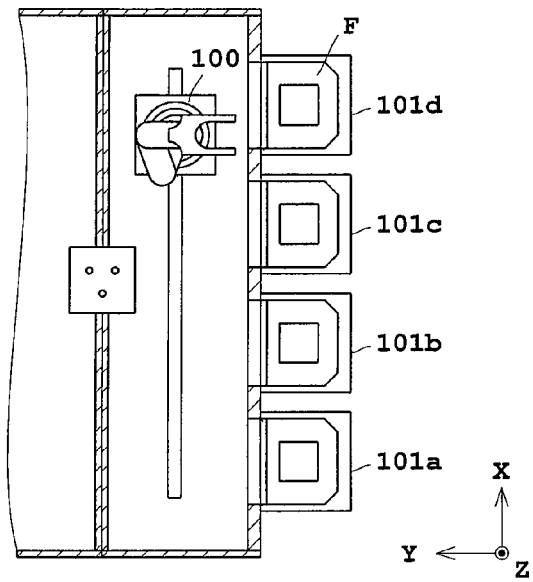
FIG. 1 is a cross section of a conventional apparatus having four openers.
Figure 2:
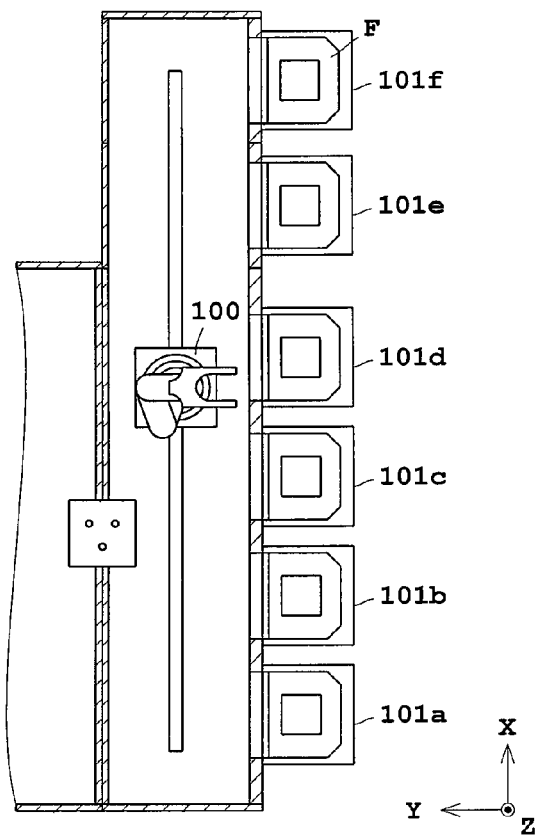
FIG. 2 is a cross section of a conventional apparatus having six openers.
Figure 3:
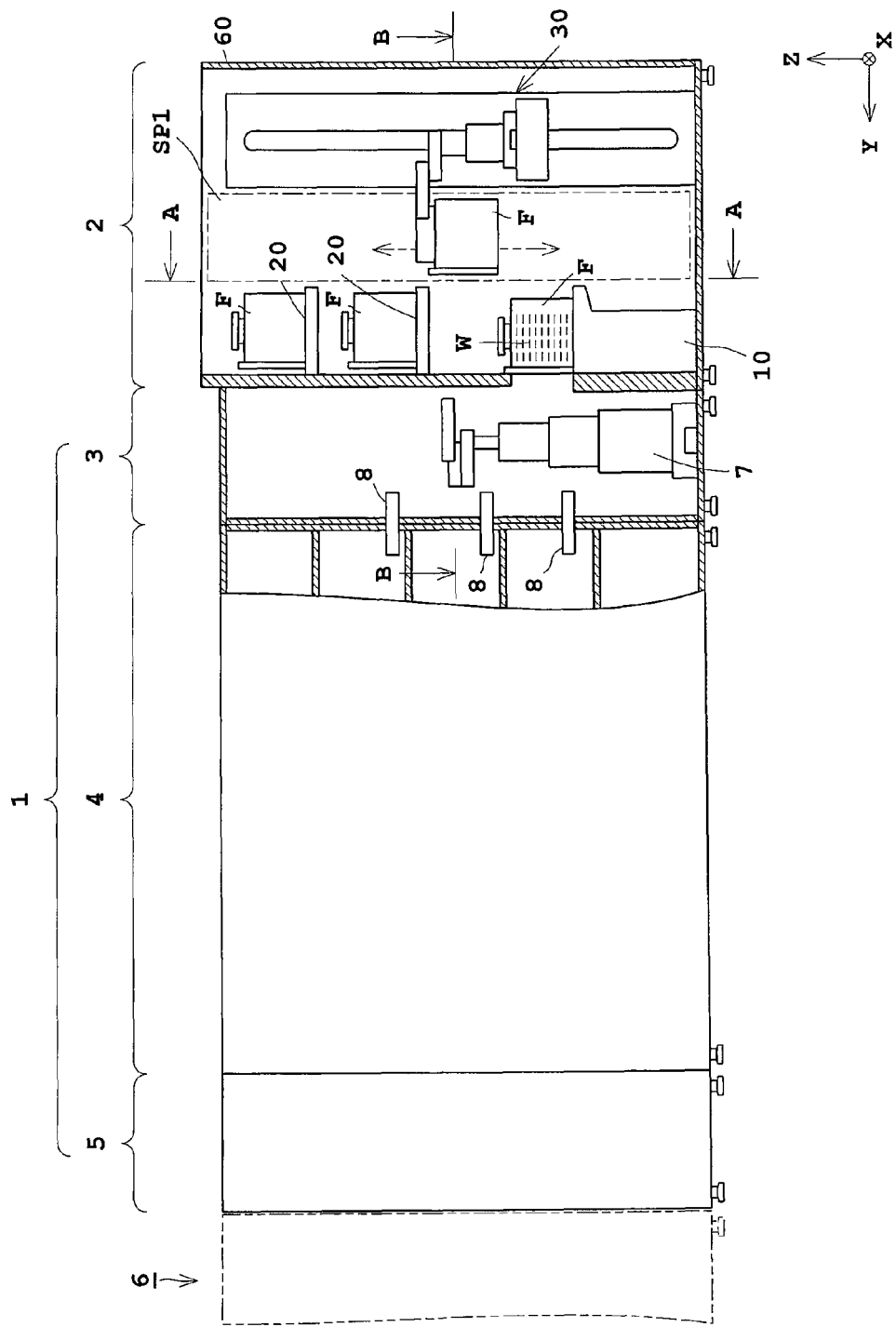
FIG. 3 is a fragmentary side view in vertical section of a substrate treating apparatus with a stocker apparatus according to an embodiment of this invention.
Figure 4:
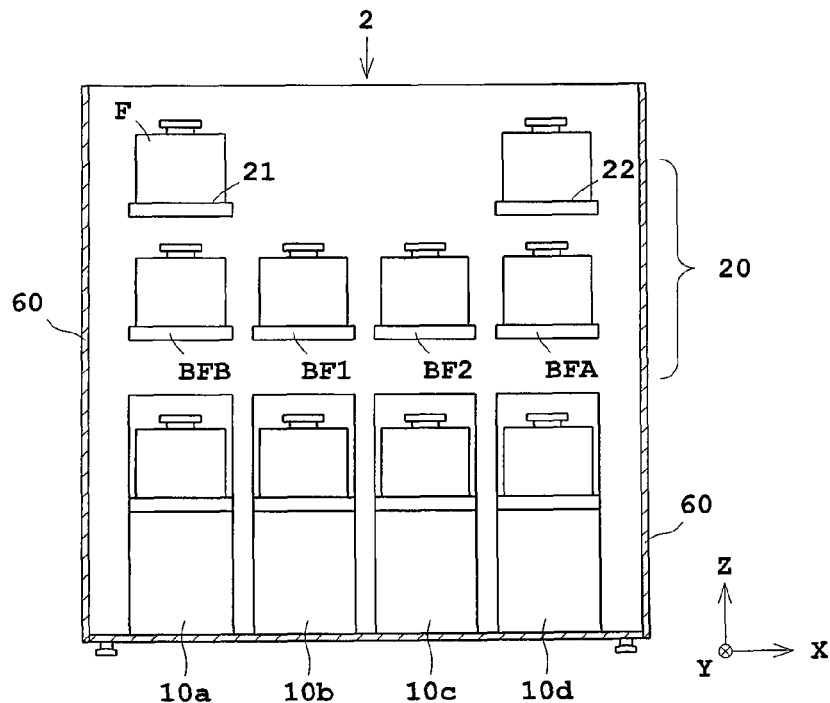
FIG. 4 is a section taken on line A-A of the stocker apparatus shown in FIG. 3.
Figure 5:
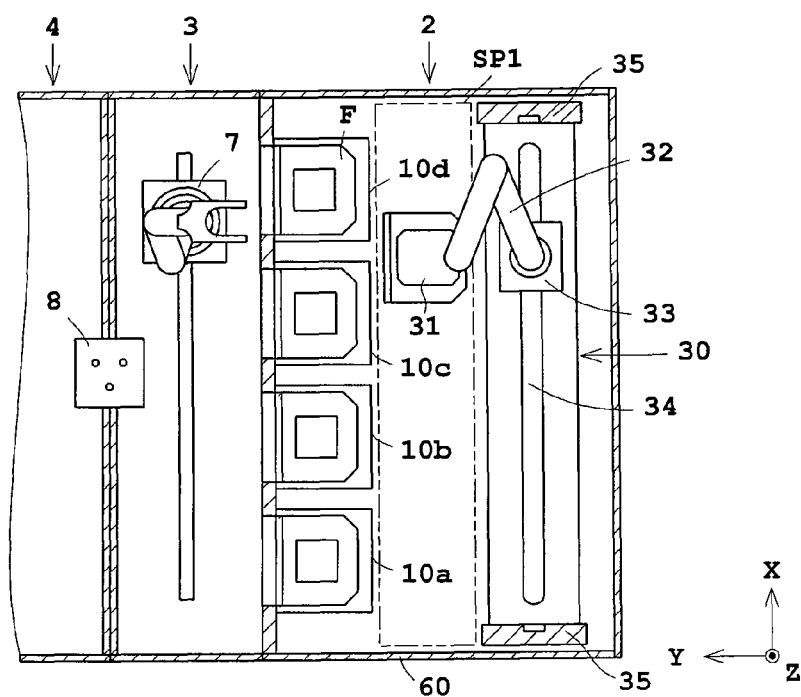
FIG. 5 is a section taken on line B-B of the substrate treating apparatus with the stocker apparatus shown in FIG. 3.

FIG. 3 is a fragmentary side view in vertical section of a substrate treating apparatus with a stocker apparatus according to an embodiment of this invention. FIG. 4 is a section taken on line A-A of the stocker apparatus shown in FIG. 3. FIG. 5 is a section taken on line B-B of the substrate treating apparatus with the stocker apparatus shown in FIG. 3.

As shown in FIG. 3, the substrate treating apparatus includes a substrate treating apparatus main body 1 of the single-substrate type, and a stocker apparatus 2 installed as connected to the substrate treating apparatus main body 1. The substrate treating apparatus main body 1 includes an indexer block 3, a treating block 4 and an interface block 5 interconnected in order from the left side of the stocker apparatus 2 in FIG. 3.

[Substrate Treating Apparatus Main Body 1]

The indexer block 3 has an indexer mechanism 7 for transporting wafers W.

This indexer mechanism 7 takes wafers W out of a FOUP F set to an opener 10 of the stocker apparatus 2, and transports the wafers W to receiving trays 8 disposed between the indexer block 3 and treating block 4. The receiving trays 8 are arranged at respective stages of the treating block 4 having a layered structure, and are used for transfer of wafers W between the indexer block 3 and treating block 4. When treated wafers W are placed on the receiving trays 8, the indexer mechanism 7 transports the wafers W from the receiving trays 8 into FOUPs F.

The treating block 4 includes treating units, not shown, such as coating units for applying photoresist, chemical treating units for treatment with a developer and heat-treating units in a vertically stacked arrangement. The treating block 4 includes also transport mechanisms, not shown, for transporting wafers W to and from the respective treating units.

The interface block 5 includes a transport mechanism, not shown, for transferring wafers W between the substrate treating apparatus and an external apparatus 6 (e.g. an exposing apparatus) juxtaposed with the substrate treating apparatus.

[Stocker Apparatus 2]

The stocker apparatus 2 includes, arranged in a plane adjoining the indexer block 3, openers 10 for receiving FOUPs F, each being a container for storing a plurality of wafers W in multiple stages, in order to deliver and receive wafers W from/into the FOUPs F, and racks 20 for receiving and keeping the FOUPs F. The stocker apparatus 2 further includes a transport mechanism 30 for holding and transporting the FOUPs F.

Each opener 10 has a shutter unit (not shown) for opening and closing a lid of a FOUP F placed on the support table of the opener 10, and opening and closing a passage port formed in a partition between the stocker apparatus 2 and indexer block 3. The indexer mechanism 7 fetches and deposits wafers W from/in the FOUP F whose lid has been opened by this shutter unit. A plurality of openers 10 are juxtaposed as described hereinafter, and will be indicated as "10a, 10b, 10c, 10d, . . . " when the openers 10 are distinguished.

A FOUP F transported by the transport mechanism 30 passes through a space SP1 between the openers 10/racks 20 and the transport mechanism 30, and freely moves horizontally and vertically (XZ plane in FIG. 3).

As shown in FIG. 4, the stocker apparatus 2 has four openers 10a-10d arranged in juxtaposition. These openers 10a-10d have different roles to play, such that the two left openers 10a and 10b are used exclusively for feeding wafers W, and the two right openers 10c and 10d for collecting wafers W. The racks 20 are arranged above these openers 10a-10d.

The racks 20 are used individually for different purposes, and include two mid-treatment storage racks BF1 and BF2 (hereinafter referred to as mid-treatment storage racks BF when the mid-treatment storage racks BF1 and BF2 are not distinguished) for receiving and keeping empty FOUPs F after wafers W are fed from the FOUPs F, one pre-treatment storage rack BFB for keeping a FOUP F storing wafers W to be treated, and one post-treatment storage rack BFA for keeping a FOUP F storing treated wafers W. The racks 20 further include an incoming rack 21 used to receive FOUPs F storing wafers W to be treated from an external transport device 40, and an outgoing rack 22 used to deliver FOUPs F storing treated wafers W to the external transport device 40.

As shown in FIG. 4, the pre-treatment storage rack BFB, mid-treatment storage racks BF1 and BF2 and post-treatment storage rack BFA are arranged in the stated order from left to right above the openers 10a-10d. The incoming rack 21 is located above the pre-treatment storage rack BFB, and the outgoing rack 22 above the post-treatment storage rack BFA.

A housing 60 providing outer peripheral walls for this stocker apparatus 2 covers the bottom and the sides, and opens at the top. Through this top opening, the external transport device 40, shown in FIG. 6, transports and places FOUPs F on the incoming rack 21, receives FOUPs F from the outgoing rack 22, and transports the FOUPs F to an apparatus at the next stage, for example.

[Construction of Transport Mechanism 30]

As shown in FIG. 5, the transport mechanism 30 includes a gripper 31 for gripping an upper portion of each FOUP F, and an articulated arm mechanism 32 connected to the gripper 31 for moving the gripper 31 back and forth. The articulated arm mechanism 32 is supported at a proximal end thereof by a support block 33. The support block 33 is movable by a first moving mechanism 34 along the direction of juxtaposition of the openers 10a-10d, that is along the direction of width (X-axis) of the stocker apparatus. This first moving mechanism 34 is vertically movable (along Z-axis) by a pair of second moving mechanisms 35. Consequently, the transport mechanism 30 can transport each FOUP F freely to positions of the openers 10 and racks 20.

Specifically, the transport mechanism 30 transports each FOUP F as follows. The articulated arm mechanism 32 advances the gripper 31, which grips and fixes the upper portion of a FOUP F placed on one of the openers 10 or racks 20. Then, the gripper 31 raises the FOUP F, and is moved back to position the FOUP F in the space SP1. The first moving mechanism 34 and second moving mechanisms 35 are operated to move the FOUP F within the space SP1 to a position opposed to a predetermined opener 10 or rack 20. Subsequently, the articulated arm mechanism 32 advances the gripper 31 to place the FOUP F on the predetermined opener 10 or rack 20. The gripper 31 is opened and moved back to complete the transport of the FOUP F.

[External Transport Device 40]

Transfer of FOUPs F between the external transport device 40 and stocker apparatus 2 will be described with reference to FIG. 6.

The external transport device 40 is a device which transports FOUPs F between the substrate treating apparatus in this embodiment and an external apparatus separate from this apparatus. In this embodiment, an OHT (Over head Hoist Transport) will be described by way of example.

The external transport device 40 includes a rail 48 laid in an overhead location such as a ceiling in a factory, and transport vehicles 41 guided by the rail 48 to transport FOUPs F. Each transport vehicle 41 has a gripper 42 for gripping and supporting a FOUP F, ropes 43 suspending the gripper 42 gripping the FOUP F, and a winch, not shown, for winding and unwinding the ropes 43 to move the FOUP F up and down.

A transport vehicle 41 transporting a FOUP F, when arriving at a location above a predetermined position for depositing the FOUP F (e.g. the incoming rack 21), lowers the FOUP F in suspension, and when the lowering is completed, causes the gripper 41 fixedly holding the FOUP F to release the FOUP F, thereby depositing the FOUP F in place.

Figure 6:
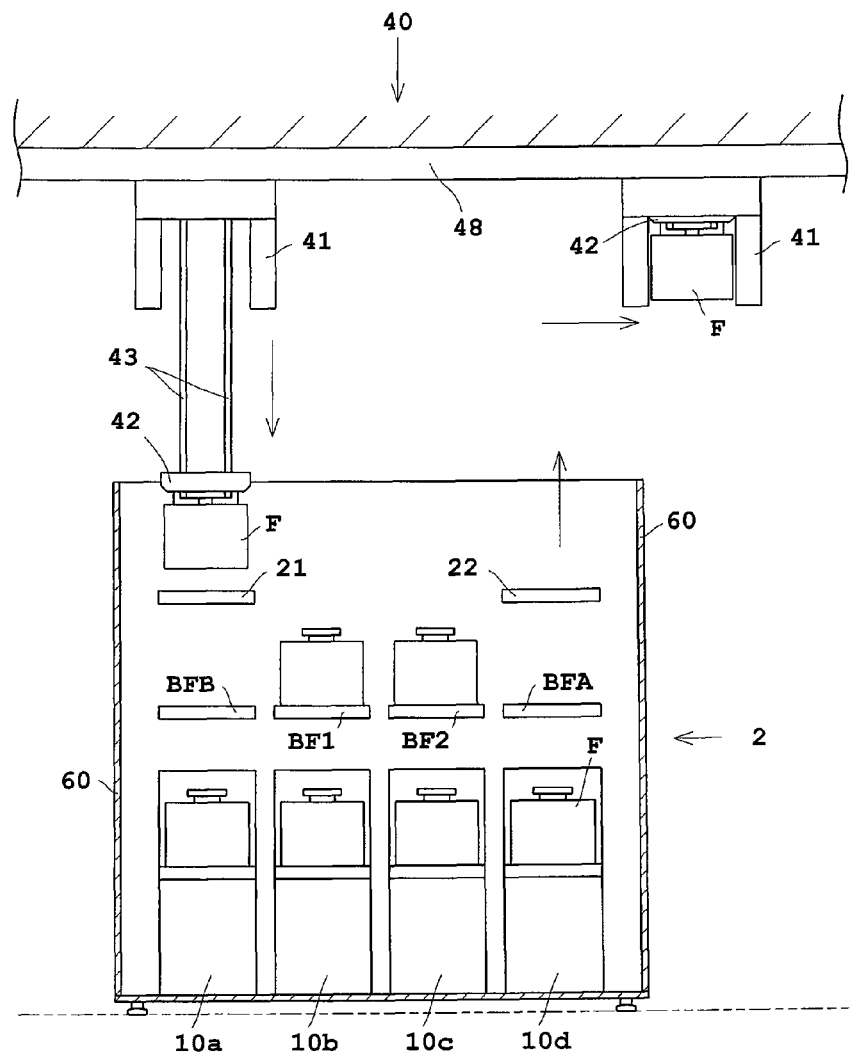
FIG. 6 is an explanatory view illustrating FOUP transfer between an external transport device and the stocker apparatus.

The left transport vehicle 41 in FIG. 6 is engaged in an operation for placing a FOUP F on the incoming rack 21. The right transport vehicle 41 has received a FOUP F from the outgoing rack 22, and is about to transport the FOUP F to the next apparatus.

[Control]

Figure 7:
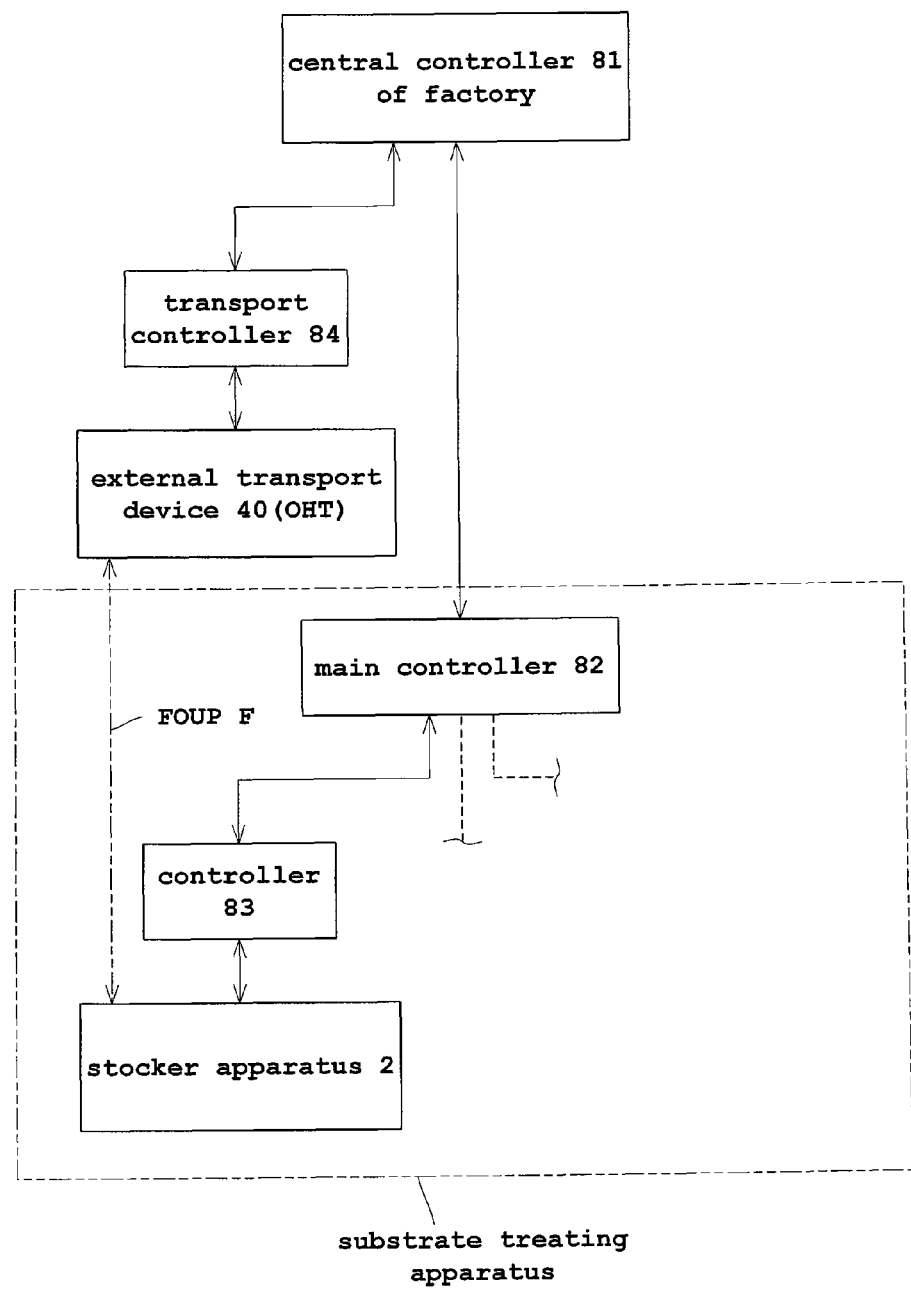
FIG. 7 is a block diagram of a control system relating to FOUP transport in the external transport device and the substrate treating apparatus in the embodiment.

FIG. 7 is a block diagram of a control system relating to the transport of FOUPs F in the external transport device 40 and the substrate treating apparatus in this embodiment.

First, as shown in FIG. 7, the stocker apparatus 2 has a controller 83 of its own independently of a main controller 82 of the substrate treating apparatus. This controller 83 controls the transport of FOUPs F by the transport mechanism 30, and the opening and closing of the lids of the FOUPs F placed on the openers 10 (FIG. 3). On the other hand, the main controller 82 of the substrate treating apparatus carries out an overall control of the stocker apparatus 2 and others.

The controller 83 of the stocker apparatus 2 is constructed capable of communication with the main controllers 82 of the substrate treating apparatus. The main controller 82 of the substrate treating apparatus is constructed capable of communication with a central controller 81 of the factory which controls production of the entire factory.

The central controller 81 of the factory which controls production of the entire factory is constructed capable of communication with a transport controller 84 of the external transport device 40.

The main controller 82 of the substrate treating apparatus transmits and receives information to/from the controller 83 of the stocker apparatus 2, and acts as a relay for transferring information transmitted from the controller 83 of the stocker apparatus 2 to the central controller 81 of the factory, for example.

The controller 83 of the stocker apparatus 2 corresponds to the control device in this invention.

Next, the transfer of FOUPs F to and from the external transport device 40 will be described with reference to FIGS. 6 and 7.

When requesting transport of a FOUP F to the incoming rack 21 of the stocker apparatus 2, for example, the controller 83 of the stocker apparatus 2 transmits to the main controller 82 of the substrate treating apparatus information requesting transport of a FOUP F storing wafers W to be treated. The main controller 82 of the substrate treating apparatus transfers the request information to the central controller 81 of the factory. Based on the request information, the central controller 81 of the factory instructs the transport controller 84 of the external transport device 40 to transport a FOUP F storing wafers W to be treated to the incoming rack 21 of the stocker apparatus 2. Thus, the external transport device 40 transports a FOUP F storing wafers W to be treated to the incoming rack 21 of the stocker apparatus 2, and places the FOUP F thereon.

In the above description, the information requesting transport of a FOUP F is transmitted from the controller 83 of the stocker apparatus 2 to the central controller 81 of the factory through the main controller 82 of the substrate treating apparatus. However, the information requesting transport of a FOUP F may be transmitted from the controller 83 of the stocker apparatus 2 to the central controller 81 of the factory through the transport controller 84 of the external transport device 40.

In the above description, the main controller 82 of the substrate treating apparatus carries out an overall control of the stocker apparatus 2 and others, while the controller 83 of the stocker apparatus 2 itself controls the transport of FOUPs F. However, the main controller 82 of the substrate treating apparatus may directly supervise the controller 83 of the stocker apparatus 2, and control the transport of FOUPs F through this controller 83.

With this arrangement, for example, the main controller 82 of the substrate treating apparatus receives information from the controller 83 of the stocker apparatus 2 that the incoming rack 21 is vacant, and based on this information, transmits information requesting transport of a FOUP F to the central controller 81 of the factory.

[Operation of the Stocker Apparatus]

Next, operation of the stocker apparatus 2 will be described with reference to FIGS. 8 through 12.

Figure 8:
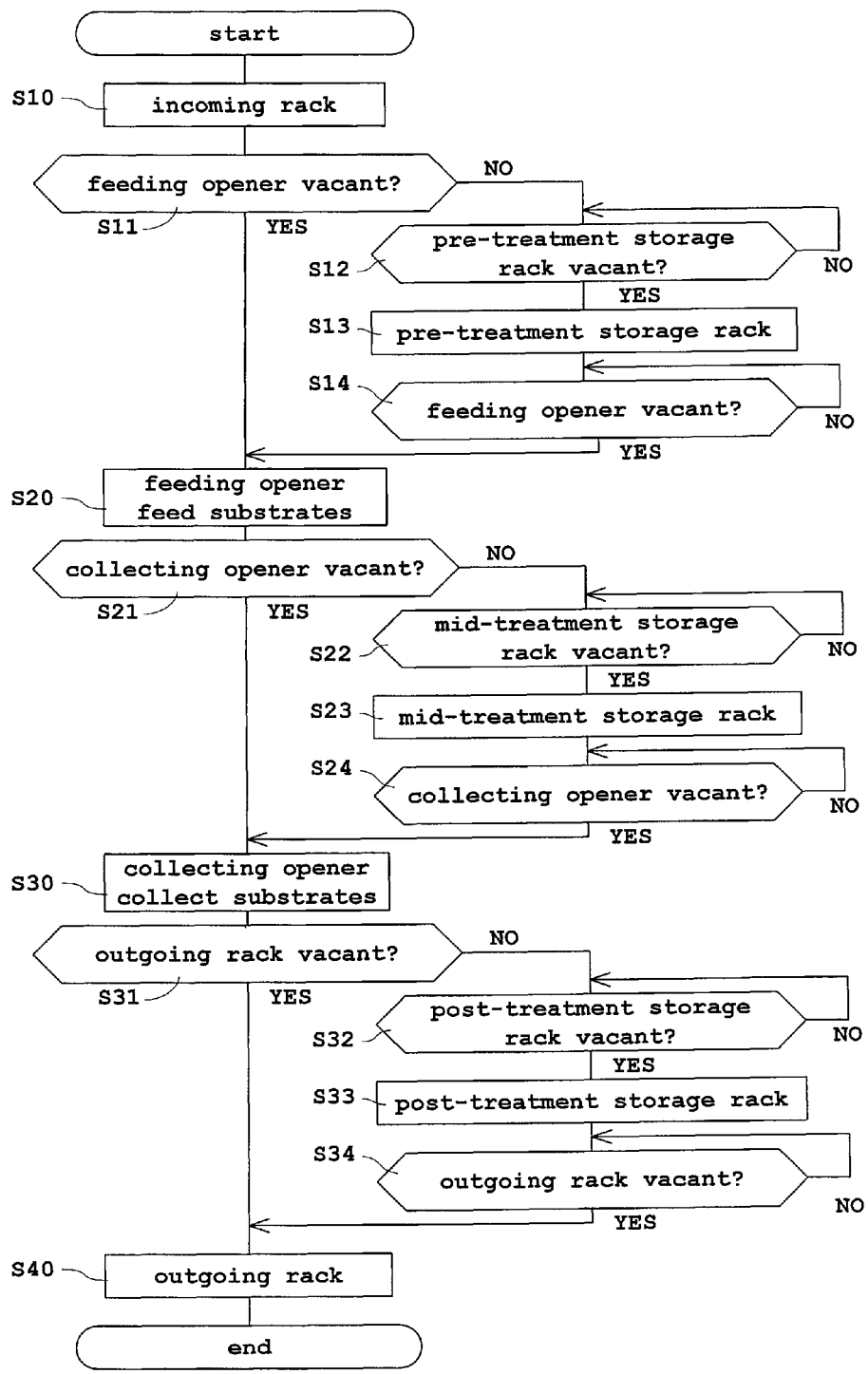
FIG. 8 is a flow chart of operation of the stocker apparatus.
Figure 9:
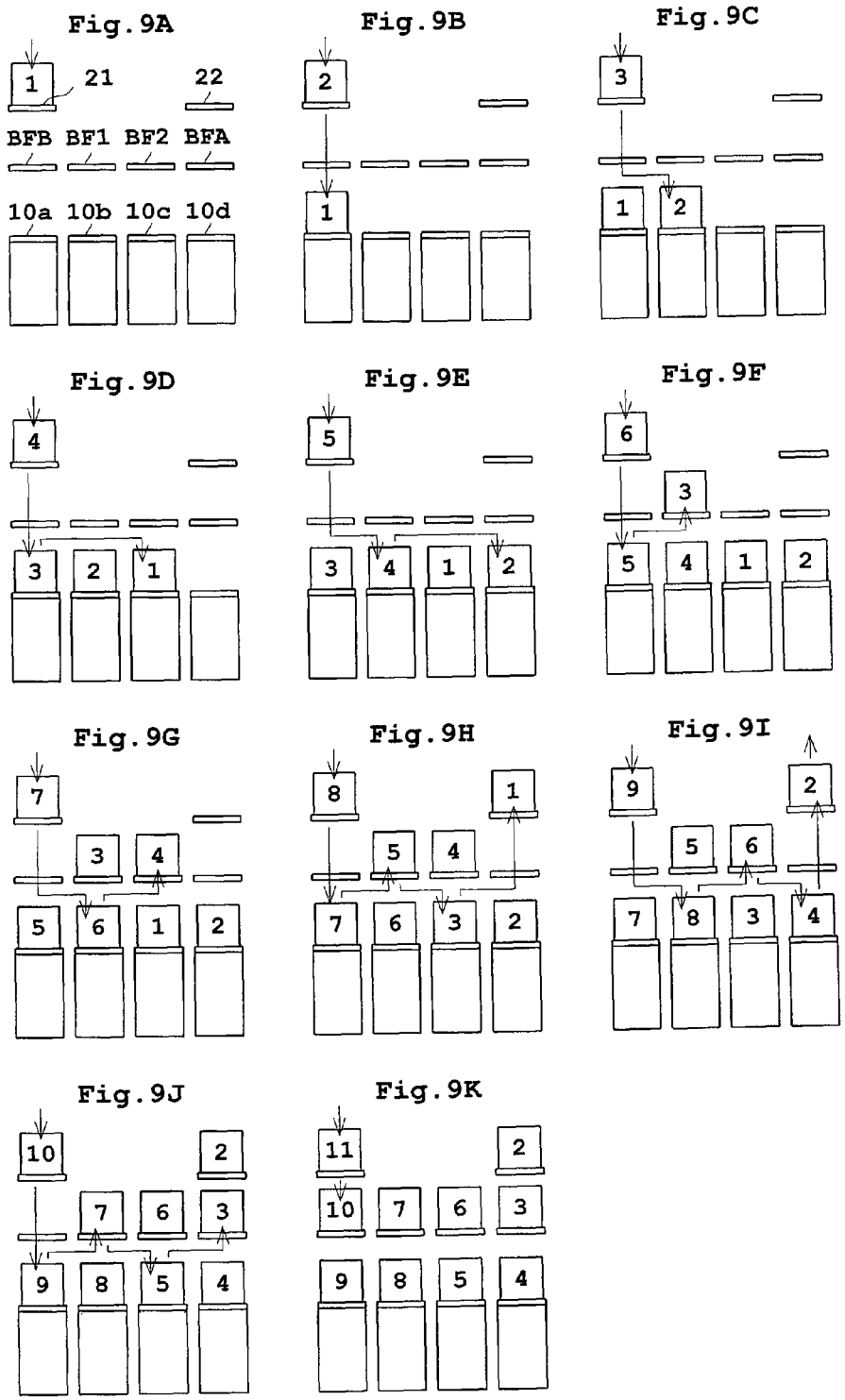
FIGS. 9A-9K are explanatory views of transport of a plurality of FOUPs within the stocker apparatus.
Figure 10:
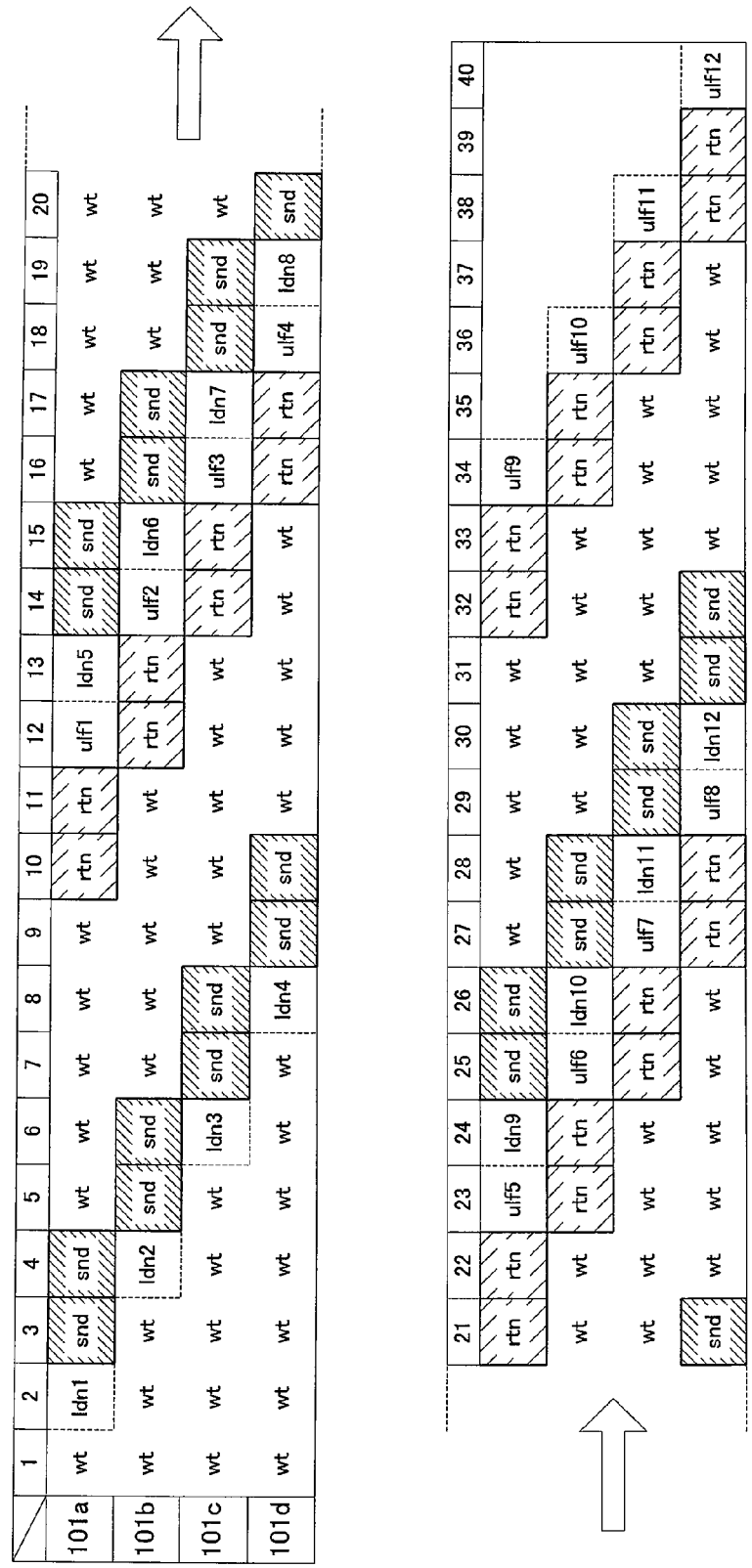
FIG. 10 is a working diagram showing operation of the conventional apparatus having four openers.
Figure 11:
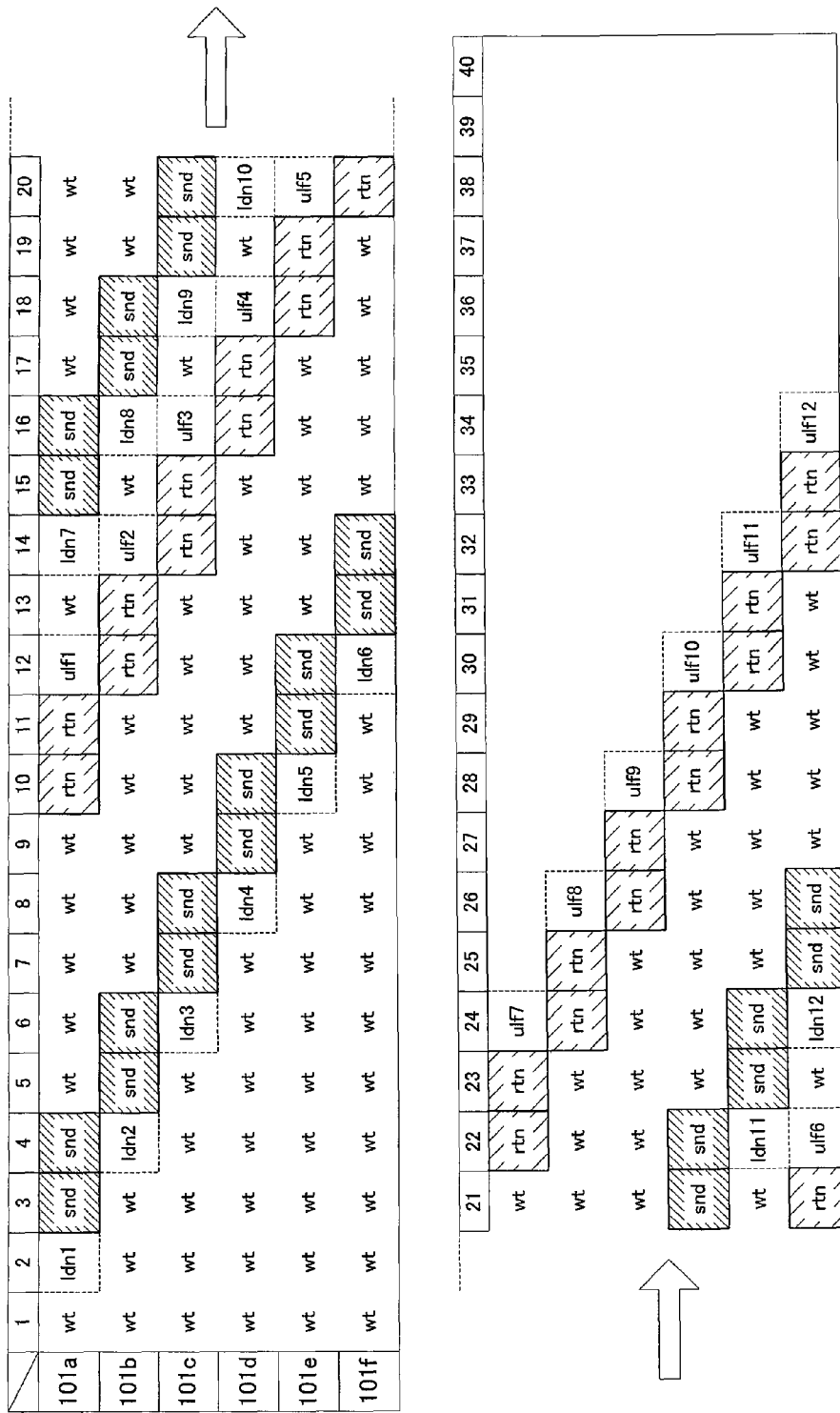
FIG. 11 is a working diagram showing operation of the conventional apparatus having six openers.
Figure 12:
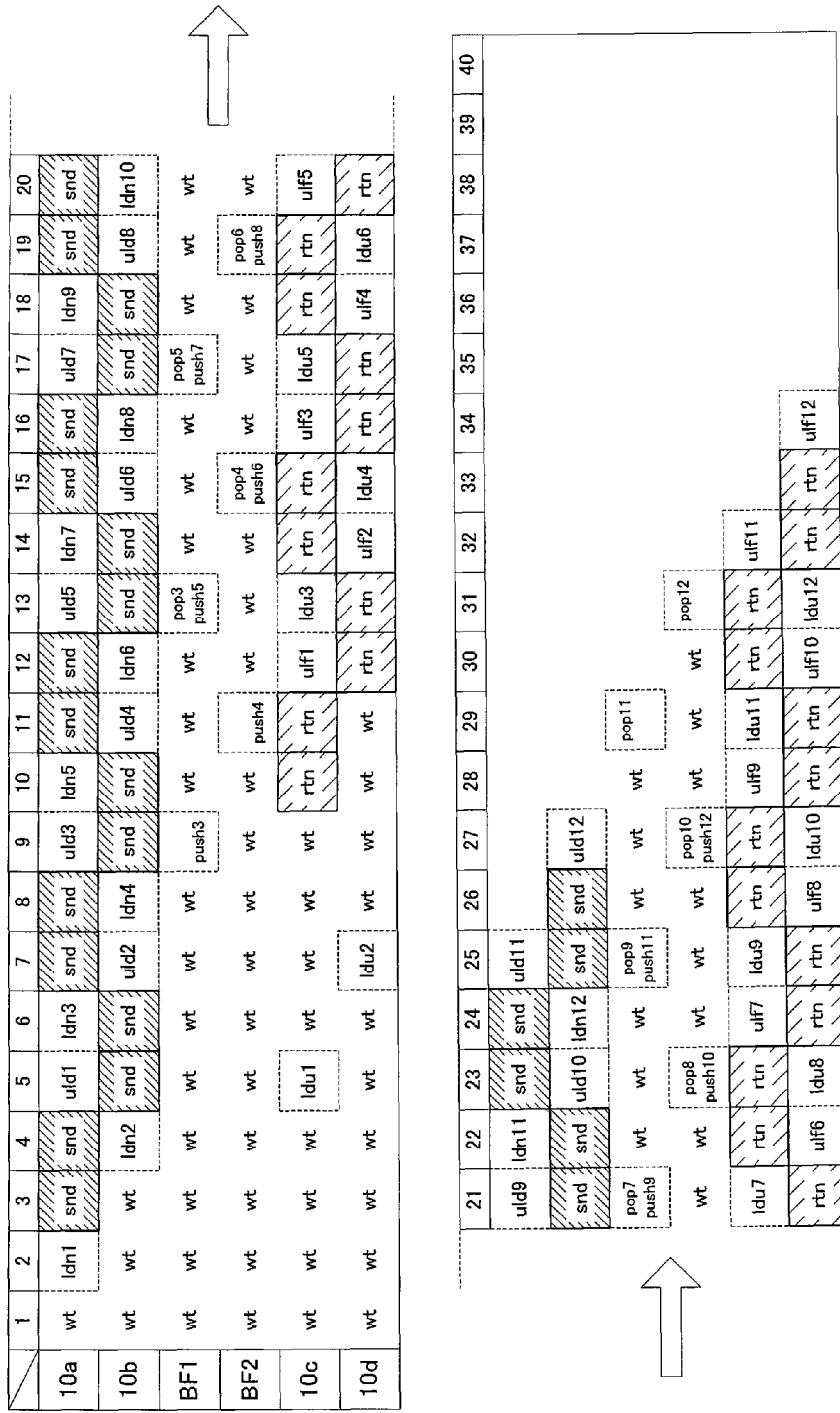
FIG. 12 is a working diagram showing operation of the stocker apparatus having four openers and two mid-treatment storage racks according to the embodiment.

FIG. 8 is a flow chart of operation of the stocker apparatus 2. FIGS. 9A-9K are explanatory view of transport of a plurality of FOUPs F within the stocker apparatus 2. FIGS. 10 through 12 are explanatory views illustrating the effect of the stocker apparatus 2 according to the embodiment.

<Description of Operation by the Flow Chart>

First, operation will be described with reference to the flow chart of FIG. 8.

This flow chart shows what determinations are made to transport one FOUP F from the time this FOUP F is placed on the incoming rack 21 in the stocker apparatus 2 until the same FOUP F is placed on the outgoing rack 22. The operation described hereinafter takes place in the stocker apparatus 2 having the construction shown in FIG. 4.

Step S10:

The external transport device 40 transports a FOUP F to the incoming rack 21 and places the FOUP F thereon.

Step S11:

When the FOUP F has been placed on the incoming rack 21, it is determined first whether the feed-only openers 10a and 10b are vacant (available for transport or not). Specifically, sensors, not shown, provided for the openers 10a and 10b detect presence or absence of FOUPs F, whereby the controller 83 determines whether the openers 10a and 10b are vacant. When the openers 10a and 10b are vacant (available for transport), the FOUP F is transported to one of the openers 10a and 10b. When, for example, only the opener 10a is vacant, the FOUP F is transported from the incoming rack 21 to the opener 10a. When both are vacant, priority may be given to the opener 10a for placement.

Step S12:

When neither of the feed-only openers 10a and 10b is vacant (that is, when transport is impossible because other FOUPs are present thereon), it is determined next whether the pre-treatment storage rack BFB is vacant. The controller 83 makes this determination based on a detection signal from a sensor, not shown, provided for the pre-treatment storage rack BFB as in the case of the openers 10a and 10b noted above. Such determination technique is the same with the other openers 10c and 10d and other racks 20, and its description will be omitted hereinafter. When the pre-treatment storage rack BFB is vacant, the FOUP F is transported from the incoming rack 21 to the pre-treatment storage rack BFB. When the pre-treatment storage rack BFB is occupied, the FOUP F is kept on standby on the incoming rack 21 until the pre-treatment storage rack BFB becomes vacant.

Step S13:

When the pre-treatment storage rack BFB is vacant, the transport mechanism 30 transports the FOUP F to the pre-treatment storage rack BFB.

Step S14:

For the FOUP F placed on the pre-treatment storage rack BFB, it is determined whether the feed-only openers 10a or 10b is vacant. When vacant, the FOUP F is transported from the pre-treatment storage rack BFB to the vacant opener 10a or 10b. When not vacant, the FOUP F remains on standby in the same position (on the pre-treatment storage rack BFB) until either one of the openers 10a and 10b becomes vacant.

Step S20:

When one of the openers 10a and 10b is vacant, the transport mechanism 30 transports the FOUP F to the vacant opener 10a or 10b. The opener 10a or 10b opens the lid of the FOUP F, and the indexer mechanism 7 feeds the wafers W successively into the substrate treating apparatus.

Step S21:

After the feeding of the wafers W from the FOUP F is completed by the indexer mechanism 7, it is determined whether the collect-only opener 10c or 10d is vacant. When vacant, the FOUP F now empty of wafers W is transported from the opener 10a or 10b having finished feeding the wafers W to the vacant opener 10c or 10d. When, for example, both openers 10c and 10d are vacant, priority may be given to the opener 10c for placement.

Step S22:

When neither of the collect-only openers 10c and 10d is vacant, it is determined next whether the mid-treatment storage rack BF1 or BF2 is vacant. When vacant, the empty FOUP F is transported from the feed-only opener 10a or 10b to the vacant one of the mid-treatment storage racks BF1 or BF2. When both are vacant, for example, priority may be given to the mid-treatment storage rack BF1 for placement. When not vacant, the FOUP F remains on standby on the opener 10a or 10b having finished feeding the wafers W until one of the mid-treatment storage rack BF1 or BF2 becomes vacant.

Step S23:

When either one of the mid-treatment storage racks BF1 or BF2 is vacant, the transport mechanism 30 transports the empty FOUP F to the vacant mid-treatment storage rack BF1 or BF2.

Step S24:

After the FOUP F is placed on the mid-treatment storage rack BF1 or BF2, it is determined whether one of the collect-only openers 10c and 10d is vacant. When vacant, the FOUP F is transported from the mid-treatment storage rack BF1 or BF2 to the vacant collect-only opener 10c or 10d. When both the mid-treatment storage racks BF1 and BF2 are loaded at this time, the FOUP F deposited earlier of the two FOUPs is transported to the vacant collect-only opener 10c or 10d. When not vacant, the FOUP F remains on standby in the same position (on the mid-treatment storage rack BF1 or BF2) until either one of the openers 10c and 10d becomes vacant.

Step S30:

When one of the collect-only openers 10c or 10d is vacant, the empty FOUP F is transported to the vacant collect-only opener 10c or 10d.

At the opener 10c or 10d having received the empty FOUP F, the indexer mechanism 7 successively deposits in the FOUP F wafers W having received the predetermined treatment. After the wafers W are collected, the opener 10c or 10d closes the lid of the FOUP F.

Step S31:

After the wafers W are collected in the FOUP F, it is determined whether the outgoing rack 22 is vacant. When vacant, the FOUP F storing the treated wafers W is transported to the outgoing rack 22 from the opener 10c or 10d having finished collecting the wafers W.

Step S32:

When the outgoing rack 22 is not vacant, it is determined next whether the post-treatment storage rack BFA is vacant. When vacant, the FOUP F storing the treated wafers W is transported from the collect-only opener 10c or 10d to the post-treatment storage rack BFA. When not vacant, the FOUP F remains on standby in the same position (on the collect-only opener 10c or 10d) until the post-treatment storage rack BFA becomes vacant.

Step S33:

When the post-treatment storage rack BFA is vacant, the transport mechanism 30 transports the FOUP F to the post-treatment storage rack BFA.

Step S34:

After the FOUP F is placed on the post-treatment storage rack BFA, it is determined whether the outgoing rack 22 is vacant. When vacant, the FOUP F storing the treated wafers W is transported from the post-treatment storage rack BFA to the outgoing rack 22. When not vacant, the FOUP F remains on standby in the same position (on the post-treatment storage rack BFA) until the outgoing rack 22 becomes vacant.

Step S40:

When the outgoing rack 22 is vacant, the transport mechanism 30 transports the FOUP F to the outgoing rack 22. Then, the FOUP F stands by in that position until it is transported to the next apparatus by the external transport device 40.

As described above, attention has been paid to one FOUP F in the flow chart shown in FIG. 8, and the FOUP F is transported in the stocker apparatus 2 based on various determinations. However, in an actual situation, a plurality of FOUPs F move one after another in the stocker apparatus 2. Operation will be described hereinafter for transporting a plurality of FOUPs F in the stocker apparatus 2.

<Operation for Transporting a Plurality of FOUPs F within the Stocker Apparatus>

Next, how a plurality of FOUPs F are transported successively based on the flow chart shown in FIG. 8 will be described with reference to FIGS. 9A through 9K. Here, the FOUPs F will be indicated with numbers affixed thereto as "FOUPs 1, 2, . . . " in the order of transport by the external transport device 40.

In FIG. 9A, FOUP 1 is transported to the incoming rack 21 by the external transport device 40.

In FIG. 9B, since the feed-only openers 10a and 10b are vacant, the transport mechanism 30 transports FOUP 1 from the incoming rack 21 to the opener 10a used with priority. After FOUP 1 is transported, the indexer mechanism 7 takes wafers W out of FOUP 1 set to the opener 10a. After FOUP 1 is transported, FOUP 2 is transported by the external transport device 40 to the incoming rack 21 vacated by FOUP 1.

In FIG. 9C, FOUP 1 is in the process of feeding wafers W. Since the feed-only opener 10b is vacant, FOUP 2 is transported from the incoming rack 21 to the opener 10b. After FOUP 2 is transported, and as soon as the feeding of wafers W from FOUP 1 is completed, wafers W are fed from FOUP 2. After FOUP 2 is transported, FOUP 3 is transported by the external transport device 40 to the incoming rack 21 vacated by FOUP 2.

In FIG. 9D, the feeding of wafers W from FOUP 1 has been completed, and empty FOUP 1 is transported to the collect-only opener 10c or 10d. Since both collect-only openers 10c and 10d are vacant at this time, empty FOUP 1 is transported from the feed-only opener 10a to the collect-only opener 10c used with priority. After empty FOUP 1 is transported, FOUP 1 stands by on the opener 10c until treatment of the wafers W is completed. FOUP 2 is in the process of feeding wafers W. After FOUP 1 is transported, FOUP 3 is transported to the feed-only opener 10a vacated by FOUP 1. After FOUP 3 is transported, FOUP 4 is transported by the external transport device 40 to the incoming rack 21 vacated by FOUP 3.

In FIG. 9E, FOUP 1 is on standby. The feeding of wafers W from FOUP 2 has been completed, and FOUP 2 is transported to the collect-only opener 10c or 10d. Since the collect-only opener 10d is vacant at this time, empty FOUP 2 is transported from the feed-only opener 10b to the collect-only opener 10d. After FOUP 2 is transported, FOUP 2 stands by on the collect-only opener 10d until treatment of the wafers W is completed. FOUP 3 is in the process of feeding wafers W. After FOUP 2 is transported, FOUP 4 is transported from the incoming rack 21 to the feed-only opener 10b vacated by FOUP 2. After FOUP 4 is transported, FOUP 5 is transported by the external transport device 40 to the incoming rack 21 vacated by FOUP 4.

In FIG. 9F, FOUPs 1 and 2 are on standby. The feeding of wafers W from FOUP 3 on the feed-only opener 10a has been completed, and empty FOUP 3 is transported from the opener 10a. FOUPs 1 and 2 still occupy (remain on standby) the collect-only openers 10c and 10d, and so a determination is made next whether the mid-treatment storage racks BF1 and BF2 are vacant. Since the mid-treatment storage racks BF1 and BF2 are both vacant, empty FOUP 3 is transported from the feed-only opener 10a to the mid-treatment storage rack BF1 used with priority. After FOUP 3 is transported, FOUP 3 stands by on the mid-treatment storage rack BF1 until the collect-only opener 10c or 10d becomes vacant. FOUP 4 is in the process of feeding wafers W. After FOUP 3 is transported, FOUP 5 is transported from the incoming rack 21 to the feed-only opener 10a vacated by FOUP 3. After FOUP 5 is transported, FOUP 6 is transported by the external transport device 40 to the incoming rack 21 vacated by FOUP 5.

In FIG. 9G, FOUP 1 successively receives treated wafers W for collection. FOUPs 2 and 3 are on standby. The feeding of wafers W from FOUP 4 on the feed-only opener 10b has been completed, and empty FOUP 4 is transported from the opener 10b. Since neither of the collect-only openers 10c and 10d is vacant at this time, empty FOUP 4 is transported to the vacant mid-treatment storage rack BF2. After FOUP 4 is transported, FOUP 4 stands by on the mid-treatment storage rack BF2 until the collect-only opener 10c or 10d becomes vacant, and until after the preceding FOUP 3 leaves the mid-treatment storage rack BF1. FOUP 5 is in the process of feeding wafers W. After FOUP 4 is transported, FOUP 6 is transported from the incoming rack 21 to the feed-only opener 10b vacated by FOUP 4. After FOUP 6 is transported, FOUP 7 is transported by the external transport device 40 to the incoming rack 21 vacated by FOUP 6.

In FIG. 9H, FOUP 1 having finished collecting wafers W is transported to the outgoing rack 22 which is vacant. FOUP 2 is collecting treated wafers W successively. After FOUP 1 is transported, FOUP 3 is transported from the mid-treatment storage rack BF1 to the collect-only opener 10c vacated by FOUP 1. FOUP 4 is on standby. After FOUP 3 is transported, empty FOUP 5 having finished feeding wafers W is transported to the mid-treatment storage rack BF1 vacated by FOUP 3. After FOUP 5 is transported, FOUP 5 stands by on the mid-treatment storage rack BF1 until the collect-only opener 10c or 10d becomes vacant, and until after the preceding FOUP 4 leaves the mid-treatment storage rack BF2. FOUP 6 is in the process of feeding wafers W. After FOUP 5 is transported, FOUP 7 is transported from the incoming rack 21 to the feed-only opener 10a vacated by FOUP 5. After FOUP 7 is transported, FOUP 8 is transported by the external transport device 40 to the incoming rack 21 vacated by FOUP 7.

In FIG. 9I, FOUP 1 is transported by the external transport device 40 to the next apparatus, for example. After FOUP 1 is transported, FOUP 2 is transported from the collect-only opener 10d to the outgoing rack 22 vacated by FOUP 1. After FOUP 2 is transported, FOUP 4 is transported from the mid-treatment storage rack BF2 to the collect-only opener 10d vacated by FOUP 2. FOUP 5 is on standby. After FOUP 4 is transported, empty FOUP 6 having finished feeding wafers W is transported to the mid-treatment storage rack BF2 vacated by FOUP 4. After FOUP 6 is transported, FOUP 6 stands by on the mid-treatment storage rack BF2 until the collect-only opener 10c or 10d becomes vacant, and until after the preceding FOUP 5 leaves the mid-treatment storage rack BF1. FOUP 7 is in the process of feeding wafers W. After FOUP 6 is transported, FOUP 8 is transported from the incoming rack 21 to the feed-only opener 10b vacated by FOUP 6. After FOUP 8 is transported, FOUP 9 is transported by the external transport device 40 to the incoming rack 21 vacated by FOUP 8.

Subsequently, the operation described with reference to FIGS. 9H and 9I is repeated for transporting FOUPs consecutively with the same timing.

In FIG. 9J, it is assumed that trouble has occurred with the external transport device 40, whereby the external transport device 40 becomes unable to transport a FOUP placed on the outgoing rack 22. FOUP 2 stands by on the outgoing rack 22. Since the outgoing rack 22 is occupied, FOUP 3 having finished collecting wafers W is transported to the post-treatment storage rack BFA which is vacant. FOUP 4 is collecting treated wafers W successively. After FOUP 3 is transported, FOUP 5 is transported from the mid-treatment storage rack BF1 to the collect-only opener 10c vacated by FOUP 3. FOUP 6 is on standby. After FOUP 5 is transported, empty FOUP 7 having finished feeding wafers W is transported to the mid-treatment storage rack BF1 vacated by FOUP 5. After FOUP 7 is transported, FOUP 7 stands by on the mid-treatment storage rack BF1 until the collect-only opener 10c or 10d becomes vacant, and until after the preceding FOUP 6 leaves the mid-treatment storage rack BF2. FOUP 8 is in the process of feeding wafers W. After FOUP 7 is transported, FOUP 9 is transported from the incoming rack 21 to the feed-only opener 10a vacated by FOUP 7. After FOUP 9 is transported, FOUP 10 is transported by the external transport device 40 to the incoming rack 21 vacated by FOUP 9.

Thus, with the post-treatment storage rack BFA provided, even when trouble occurs with the external transport device 40, whereby the external transport device 40 becomes unable to transport FOUP F placed on the outgoing rack 22, the apparatus can continue its operation without interrupting treatment.

When the current timing of transport is maintained thereafter, the FOUPs are transported while the post-treatment storage rack BFA remains blocked. However, the state of not using the post-treatment storage rack BFA may be reinstated by advancing the timing of transporting FOUPs F from the outgoing rack 22 to the external transport device 40.

In FIG. 9K, it is assumed that, following the state shown in FIG. 9J, FOUP 2 on the outgoing rack 22 cannot be transported because of the trouble with the external transport device 40. Since the outgoing rack 22 is occupied, FOUP 3 remains on standby on the post-treatment storage rack BFA. Since neither of the outgoing rack 22 and post-treatment storage rack BFA is vacant, FOUP 4 having finished collecting wafers W stands by on the collect-only opener 10d. FOUP 5 is in the process of collecting treated wafers W successively. FOUPs 6 and 7 are on standby. Since the collect-only openers 10c and 10d and the mid-treatment storage racks BF1 and BF2 are all occupied, empty FOUP 8 having finished feeding wafers W stands by on the feed-only opener 10b. FOUP 9 is in the process of feeding wafers W. Since the feed-only openers 10a and 10b are occupied, FOUP 10 is transported from the incoming rack 21 to the pre-treatment storage rack BFB which is vacant. After FOUP 10 is transported, FOUP 11 is transported by the external transport device 40 to the incoming rack 21 vacated by FOUP 10.

Thus, with the pre-treatment storage rack BFB provided, even when FOUPs cannot be transported to the feed-only opener 10a or 10b, FOUP F on the incoming rack 21 can be transported to the pre-treatment storage rack BFB. Consequently, even when the external transport device 40 is transporting a FOUP F halfway from an upstream apparatus, FOUP F can be transported to the incoming rack 21 without interrupting the transport.

As described above, in the stocker apparatus 2 with the feed-only openers 10a and 10b, collect-only openers 10c and 10d, and racks 20 for receiving FOUPs F, as shown in FIG. 4, individual FOUPs F are successively transported, with determinations made whether the destination openers 10 or racks 20 are vacant, based on the flow chart shown in FIG. 8. Based on this flow chart, a plurality of FOUPs F act in parallel as shown in FIGS. 9A through 9K. This increases the efficiency of transporting FOUPs F as describe hereinafter, thereby allowing the substrates to be fed and collected efficiently.

<Advantages of the Stocker Apparatus 2 according to the Embodiment>

The advantages of the stocker apparatus 2 according to the embodiment will be described as compared with the conventional apparatus not having the stocker apparatus 2.

FIG. 10 is a working diagram showing operation of the conventional apparatus having four openers 101a-101d (hereinafter called the first conventional apparatus). FIG. 11 is a working diagram showing operation of the conventional apparatus having six openers 101a-101f (hereinafter called the second conventional apparatus). FIG. 12 is a working diagram showing operation of the stocker apparatus 2 having four openers 10a-10d and two mid-treatment storage racks BF1 and BF2 according to the embodiment.

Here, description will be made of operations taking place when each of the substrate treating apparatus according to the embodiment and the first and second conventional apparatus handles 12 FOUPs F (each FOUP storing 25 wafers W). As will be clear from the following description, the apparatus with the stocker apparatus 2 having four openers 10a-10d and two mid-treatment storage racks BF1 and BF2 according to the embodiment achieves the same FOUP transporting efficiency as the second conventional apparatus having six openers 101a-101f. FOUP transporting operation will be described hereinafter in order of the first conventional apparatus, second conventional apparatus, and apparatus according to the embodiment.

In the working diagrams shown FIGS. 10 through 12, the vertical axis represents the openers 10 and 101, or the mid-treatment storage racks BF, while the horizontal represents time steps. The spacing between the time steps is irrelevant to real time.

{Operation of the First Conventional Apparatus Having Four Openers 101a-101d}

Reference is made to FIG. 10. As used in FIG. 10, sign "ldn" means operation for placing FOUPs F on the openers 101. Sign "snd" means operation for feeding wafers W from FOUPs F. Sign "rtn" means operation for collecting wafers W into FOUPs F. Sign "ulf" means operation for unloading FOUPs F from the apparatus. Sign "wt" means a standby state (idle state). Numeral "1" in "ldn1" indicates a FOUP F transported, and in this case indicates the first FOUP F. For example, an operation for placing the 12th FOUP F on opener 101 is expressed as "ldn12". In describing the operation, 12 FOUPs are processed by way of example.

First, steps of loading FOUPs F into the substrate treating apparatus, feeding and collecting wafers W and unloading FOUPs F from the apparatus will be described by taking FOUP 1 on the opener 101a for example.

In step 2, FOUP 1 is placed on the opener 101a by the external transport device 40 (ldn1). Next, in steps 3 and 4, the indexer mechanism 7 feeds wafers W from FOUP 1 to the substrate treating apparatus main body 1 (snd). The wafers W fed successively receive a predetermined treatment in each treating unit of the substrate treating apparatus. In steps 5-9, FOUP 1 is kept on standby (wt), with no transport action taking place, since the wafers W are being treated successively. During this period, empty FOUP 1 with all the wafers W fed out stands by in the same position. In steps 10 and 11, the indexer mechanism 7 successively collects treated wafers W back into FOUP 1 (rtn). In step 12, FOUP 1 having collected the treated wafers W is transported to the next apparatus by the external transport device 40 (ulf1).

The above is the treating process for one FOUP F.

The processing of FOUPs F is carried out using the opener 101a, which is followed by the opener 101b, opener 101c and opener 101*d* in the stated order. After the opener 101*d*, substrate treatment is carried out again for FOUP F on the opener 101*a*.

The operation for feeding wafers W from FOUPs F is carried out in such a way that, for example, after wafers W are fed from FOUP 1 placed on the opener 101*a* (step 4), and as soon as necessary preparations are completed, wafers W are fed from FOUP 2 placed on the opener 101*b* (step 5).

Similarly, the operation for collecting wafers W into FOUPs F is carried out in such a way that, for example, after wafers W are collected into FOUP 1 placed on the opener 101*a* (step 11), and as soon as necessary preparations are completed, wafers W are collected into FOUP 2 placed on the opener 101*b* (step 12).

According to the working diagram shown in FIG. 10, the processing for the 12 FOUPs F is completed when the last FOUP F is taken out by the external transport device 40 in step 40.

{Operation of the Second Conventional Apparatus Having Six Openers 101*a*-101*f*}

Reference is made to FIG. 11. The signs and numerals used in FIG. 11 are the same in meaning as in FIG. 10. The processing of one FOUP F is as described above.

The processing of FOUPs F is carried out in the order of openers 101*a*, 101*b*, 101*c*, 101*d*, 101*e* and 101*f*. After the opener 101*f*, processing is carried out again for FOUP F on the opener 101*a*.

The operation for feeding wafers W is carried out as described above. That is, after wafers W have been fed from one FOUP F, and as soon as preparations are completed for FOUP F placed on the opener 101 next in order, wafers W are fed from that FOUP F.

The operation for collecting wafers W is carried out also as described above. That is, after wafers W have been collected into one FOUP F, and as soon as preparations are completed for FOUP F placed on the opener 101 next in order, wafers W are collected into that FOUP F.

According to the working diagram shown in FIG. 11, the processing for the 12 FOUPs F is completed when the last FOUP F is taken out by the external transport device 40 in step 34.

The first conventional apparatus having four openers 101*a*-101*d* shown in FIG. 10 completes the processing for the 12 FOUPs in step 40. On the other hand, the second conventional apparatus having six openers 101*a*-101*f* shown in FIG. 11 completes the processing in step 34. Thus, the second conventional apparatus has a higher efficiency of transporting the FOUPs than the first conventional apparatus. This is because, as shown in FIG. 11, wafers W are fed from the FOUPs F placed on the openers 101*a*-101*f* such that, in steps 14 and 15, the indexer mechanism 7, after having fed all the wafers W from the FOUP F placed on the opener 101*f*, continues to feed wafers W from the FOUP F on the opener 101*a*. Similarly, the collection of wafers W is carried out continuously. That is, the second conventional apparatus carries out the feeding and collection of wafers W continuously.

With the first conventional apparatus shown in FIG. 10, on the other hand, in steps 10-14, when the feeding of wafers W from FOUP 4 placed on the opener 101*d* is completed, FOUP 1 on the next opener 101*a* is still in the midst of successively collecting treated wafers W (step 11). That is, after treated wafers W are collected in FOUP 1 on the opener 101*a*, FOUP 1 is transported to the next apparatus by the external transport device 40, then FOUP 5 storing wafers W to be treated is transported, but these wafers W can be fed only after preparations are completed. The situation is the same in steps 21-25 also.

With the first conventional apparatus shown in FIG. 10, in steps 17-21, when the collection of wafers W in FOUP 4 placed on the opener 101*d* is completed, the next opener 101*a* is in the state of the wafers W fed therefrom still being treated (step 18). That is, the operation for collecting wafers W can be carried out only after completion of the treatment of the wafers W fed from FOUP F on the opener 101*a*. The situation is the same in steps 28-32 also.

That is, the first conventional apparatus having four openers cannot carry out the feeding and collection of wafers W continuously, and has a lower efficiency of transporting the FOUPs than the second conventional apparatus. This results in a longer time taken before completion of the treatment.

{Operation of the Substrate Treating Apparatus with Stocker Apparatus 2 in This Embodiment}

FIG. 12 is a working diagram of the substrate treating apparatus with the stocker apparatus 2 (four openers 10*a*-10*d* and two mid-treatment storage racks BF1 and BF2) in this embodiment. The openers 10*a* and 10*b* are used exclusively for feeding wafers W to be treated, and the openers 10*c* and 10*d* exclusively for collecting treated wafers W.

The signs and numerals used in FIG. 12 are the same in meaning as in FIG. 10. The meanings of additional signs used in FIG. 12 are as follows. Sign "uld" means an operation for transporting FOUP F having fed wafers W from one of the feed-only openers 10 to a different location. Sign "ldu" means an operation for transporting empty FOUP F from a different location to one of the collect-only openers 10. Sign "push" means an operation for transporting empty FOUP F from one of the feed-only openers 10 to one of the mid-treatment storage racks BF. Sign "pop" means an operation for transporting empty FOUP F from one of the mid-treatment storage racks BF to one of the collect-only openers 10.

The processing of one FOUP F not using the mid-treatment storage rack BF1 or BF2, and that using the mid-treatment storage rack BF1 or BF2, will be described in order.

First, the processing of one FOUP F not using the mid-treatment storage rack BF1 or BF2 will be described taking "FOUP 1" for example.

In step 2, FOUP 1 placed on the incoming rack 21 by the external transport device 40 is transported to the opener 10*a* (ldn1). In steps 3 and 4, the indexer mechanism 7 feeds wafers W from FOUP 1 (snd). The wafers W fed successively receive a predetermined treatment in each treating unit of the substrate treating apparatus. In step 5, the transport mechanism 30 transports FOUP 1 made empty of wafers W to a different location. The collect-only openers 10*c* and 10*d* are both vacant at this time, and empty FOUP 1 is transported to the opener 10*c* (uld1 for opener 10*a*, and ldu1 for opener 10*c*). In steps 6-9, FOUP 1 is kept on standby (wt), with no transport action taking place, since the wafers W are being treated. In steps 10 and 11, the indexer mechanism 7 successively collects treated wafers W into FOUP 1 transported to the opener 10*c* (rtn). In step 12, the transport mechanism 30 transports FOUP 1 having collected the treated wafers W from the opener 10*c* to the outgoing rack 22. FOUP 1 transported to the outgoing rack 22 is transported to the next apparatus by the external transport device 40 (ulf1 for opener 10*c*).

Next, the processing of one FOUP F using the mid-treatment storage rack BF1 or BF2 will be described taking "FOUP 5" for example.

In step 10, FOUP 5 placed on the incoming rack 21 by the external transport device 40 is transported to the opener 10*a* (ldn5). In steps 11 and 12, the indexer mechanism 7 feeds wafers W from FOUP 5 (snd). The wafers W fed successively receive the predetermined treatment in each treating unit of the substrate treating apparatus. In step 13, the transport mechanism 30 transports FOUP 5 made empty of wafers W to a different location. At this time, the collect-only opener 10*c* receives FOUP 3 transported from the mid-treatment storage rack BF1 (pop3, Idu3), and the collect-only opener 10*d* is occupied by FOUP 2 which is collecting treated wafers W successively (rtn). That is, neither of the collect-only openers 10*c* and 10*d* is vacant. Thus, FOUP 5 is transported to the mid-treatment storage rack BF1 vacated by FOUP 3 having been transported to the opener 10*c* (uld5 for opener 10*a*, and pushy for mid-treatment storage rack BF1). In steps 14-16, the mid-treatment storage rack BF1 is in a standby state with no transport operation taking place (wt). In step 17, FOUP 3 is transported from the opener 10*c* to the outgoing rack 22 (ulf3), leaving the opener 10*c* vacant. At this time, FOUP 5 has been deposited before FOUP 6 present on the mid-treatment storage rack BF2. FOUP 5 therefore is transported with priority (pop5 for mid-treatment storage rack BF1, and Idu5 for opener 10*c*). Incidentally, FOUP 7 is transported to the mid-treatment storage rack BF1 vacated by FOUP 5 (uld7, push7). In steps 18 and 19, the indexer mechanism 7 successively collects treated wafers W into FOUP 5 on the opener 10*c* (rtn). In step 20, FOUP 5 having collected treated wafers W is transported from the opener 10*c* to the outgoing rack 22. FOUP 5 transported to the outgoing rack 22 is transported to the next apparatus by the external transport device 40 (step 20, ulf5 for opener 10*c*).

The feeding of wafers W is carried out alternately in the order of opener 10*a*, opener 10*b*, 10*a*, 10*b*, 10*a*, .... The collection of wafers W is carried out alternately in the order of opener 10*c*, opener 10*d*, 10*c*, 10*d*, 10*c*, ....

According to the working diagram shown in FIG. 12, the processing for the 12 FOUPs F is completed when the last FOUP F is taken out by the external transport device 40 in step 34. That is, the apparatus in this embodiment completes the operation with the same number of steps as the foregoing second conventional apparatus having six openers 101 shown in FIG. 11. This is because both apparatus feed wafers W continuously.

The substrate treating apparatus with the stocker apparatus 2 in this embodiment and the second conventional apparatus having six openers 101*a*-101*f*, as shown in step 12 in FIG. 12 and FIG. 11, for example, carry out a step of feeding wafer W to be treated from FOUP F, a step of collecting treated wafers W in FOUP F, a step of putting FOUP F made empty of wafers W on standby, a step of placing FOUP F storing wafers W to be treated on the opener 10 or 101, and a step of causing FOUP F for which the substrate treatment is completed to be transported to the next apparatus. That is, the two apparatus carry out the same operation although their constructions are different.

That is, the substrate treating apparatus with the stocker apparatus 2 in this embodiment realizes FOUP transporting efficiency comparable to that of the second conventional apparatus having six openers 101, and can feed and collect wafers W continuously.

A comparison between the substrate treating apparatus with the stocker apparatus 2 in this embodiment and the second conventional apparatus shows that, while the apparatus in this embodiment has a width for accommodating four openers 10 juxtaposed, the second conventional apparatus has a width for accommodating six openers 101. That is, the apparatus in this embodiment, compared with the second conventional apparatus having the same FOUP transporting efficiency, can reduce the size in the transverse (X-axis) direction of the apparatus, and can inhibit enlargement of the apparatus, that is an installation area at the time of installation in a factory or the like.

Where the conventional apparatus has the number of openers 101 increased to seven or eight, the apparatus in this embodiment can realize a similar effect easily by adding mid-treatment storage racks BF.

Modifications

This invention is not limited to the foregoing embodiment, but may be modified as set out below. Portions overlapping the foregoing embodiment will not be described.

(1) Interlock Mechanism 70 for Preventing Interference Between Grippers:

The stocker apparatus 2 may include an interlock mechanism 70 for preventing interference taking place when the gripper 42 of the external transport device 40 and the gripper 31 of the transport mechanism 30 access the incoming rack 21 or outgoing rack 22 for transfer of FOUPs F at the same time. The term "transfer position" will be used hereinafter when not distinguished. The term "interlock mechanism 70" will be used when interlock mechanisms 70A-E described hereinafter are not distinguished. Description will be made in order starting with an interlock mechanism 70A.

<Interlock Mechanism 70A>

Figure 13A:
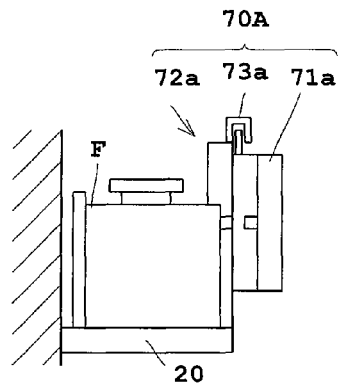
FIG. 13A is a side view of an interlock mechanism 70A according to modification (1)
Figure 13B:
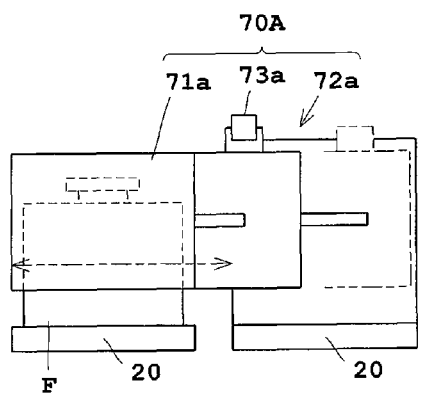
FIG. 13B is a front view of the interlock mechanism 70A according to modification (1)

FIG. 13A is a side view of a slide type interlock mechanism 70A. FIG. 13B is a front view of the slide type interlock mechanism 70A.

The interlock mechanism 70A includes a slide door 71*a* slidable sideways to open and close, a slide door switch mechanism 72*a* for opening and closing the slide door 71*a*, and a sensor 73*a* for detecting opening and closing of the slide door 71*a*. The interlock mechanism 70A is provided on a side of each of the incoming rack 21 and outgoing rack 22 to shut a passage through which the gripper 31 of the transport mechanism 30 accesses the incoming rack 21 or outgoing rack 22 for transfer of FOUP F.

The controller 83 of the stocker apparatus 2 drives the door switch mechanism 72*a* to open and close the door 71*a*, and receives a detection signal from the sensor 73*a*. The controller 83 controls operation of the interlock mechanism 70A as described hereinafter.

Usually, the slide door 71*a* is open so that the transport mechanism 30 may access the transfer position. The controller 83 of the stocker apparatus 2 makes a determination based on the detection signal from the sensor 73*a*, and transmits, to the central controller 81 of the factory through the main controller 82 of the substrate treating apparatus, information (hereinafter called "access propriety information" as appropriate) indicating whether the external transport device 40 may access the stocker apparatus 2 (access permitted) or not (access prohibited). In this case, information "access prohibited" is transmitted since the slide door 71*a* is open so that the transport mechanism 30 can make access, and access of the external transport device 40 is prohibited. Based the access propriety information (access prohibited), the central controller 81 of the factory gives instructions (access prohibited) to the transport controller 84 of the external transport device 40.

For example, when the external transport device 40 accesses the transfer position, as shown in FIG. 7, the transport controller 84 of the external transport device 40 transmits information requesting access to the transfer position of the stocker apparatus 2 (hereinafter called "access request information") to the central controller 81 of the factory. The central controller 81 of the factory transmits this information to the controller 83 of the stocker apparatus 2 through the main controller 82 of the substrate treating apparatus. Upon receipt of the access request information, the controller 83 of the stocker apparatus 2 closes the slide door 71*a* to prohibit access of the transport mechanism 30 to the transfer position. Based on the detection signal from the sensor 73*a*, the controller 83 of the stocker apparatus 2 confirms that the slide door 71*a* is closed, and transmits access propriety information (information of "access permitted") to the central controller 81 of the factory through the main controller 82 of the substrate treating apparatus. Upon receipt of instructions from the central controller 81 of the factory, the transport controller 84 of the external transport device 40 accesses the transfer position.

After a transfer operation, the transport controller 84 of the external transport device 40 transmits, through the path noted above, information canceling the request for access to the transfer position of the stocker apparatus 2 (hereinafter called "access request cancel information"). Upon receipt of the access request cancel information, the controller 83 of the stocker apparatus 2 opens the slide door 71*a*. Then, based on the signal from the sensor 73*a*, the controller 83 transmits the access propriety information prohibiting access again.

When the controller 83 of the stocker apparatus 2 receives the access request information, the transport mechanism 30 may be engaged in an operation to transport a FOUP F between the transfer position and another position in response to instructions of the controller 83 of the stocker apparatus 2. In such a case, the controller 83 waits until that operation is completed. Subsequently, the controller 83 of the stocker apparatus 2 closes the slide door 71*a*.

The controller 83 of the stocker apparatus 2 may transmit the access propriety information, access request information or access request cancel information through the transporting controller 84 of the external transport device 40 to the central controller 81 of the factory which supervises production of the entire factory.

<Interlock Mechanism 70B>

Figure 14A:
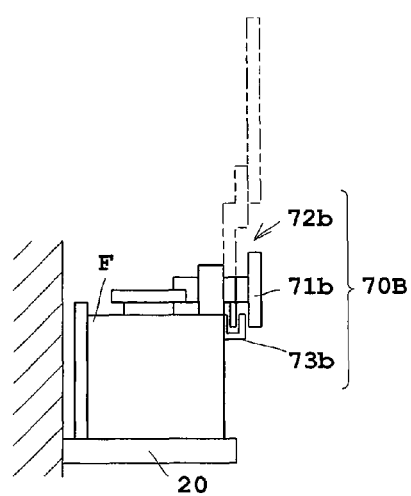
FIG. 14A is a side view of an interlock mechanism 70B according to modification (1)
Figure 14B:
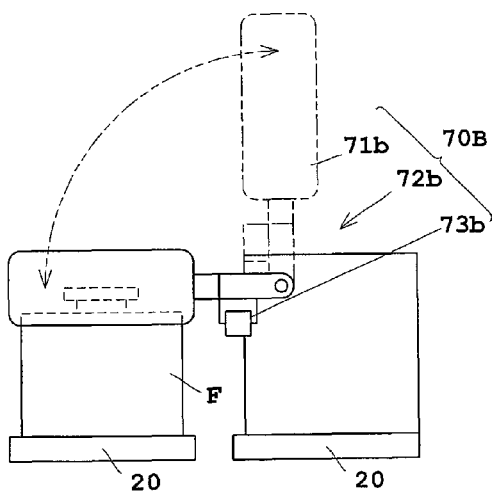
FIG. 14B is a front view of the interlock mechanism 70B according to modification (1)

FIG. 14A is a side view of a rotary type interlock mechanism 70B. FIG. 14B is a front view of the rotary type interlock mechanism 70B.

The interlock mechanism 70B includes a swing door 71*b* with a proximal end thereof rotatably supported to be swingable open and close, a swing door switch mechanism 72*b* for opening and closing the swing door 71*b*, and a sensor 73*b* for detecting opening and closing of the swing door 71*b*.

The controller 83 of the stocker apparatus 2 drives the door switch mechanism 72*b* to open and close the swing door 71*b*, and receives a detection signal from the sensor 73*b*. Operation of the interlock mechanism 70B is controlled as is operation of the interlock mechanism 70A.

<Interlock Mechanism 70C>

Figure 15A:
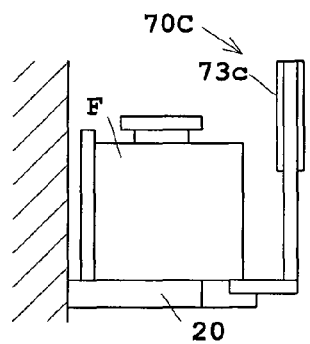
FIG. 15A is a side view of an interlock mechanism 70C according to modification (1)
Figure 15B:
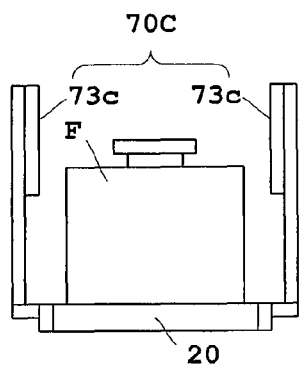
FIG. 15B is a front view of the interlock mechanism 70C according to modification (1)

FIG. 15A is a side view of an interlock mechanism 70C. FIG. 15B is a front view of the interlock mechanism 70C.

The interlock mechanism 70C includes a sensor 73*c* disposed laterally of a region of the transfer position for detecting the gripper 31 of the transport mechanism 30 entering from a side.

When the sensor 73*c* detects entry, that is when the gripper 31 of the transport mechanism 30 is present in the transfer position, the controller 83 of the stocker apparatus 2 prohibits access of the external transport device 40 to the transfer position of the stocker apparatus 2. On the other hand, when the sensor 73 does not detect entry, that is when the gripper 31 of the transport mechanism 30 is absent from the transfer position, the controller 83 of the stocker apparatus 2 permits access of the external transport device 40 to the transfer position of the stocker apparatus 2.

For example, when the external transport device 40 accesses the transfer position, as shown in FIG. 7, the transport controller 84 of the external transport device 40 transmits access request information to the central controller 81 of the factory. The central controller 81 of the factory transmits this information to the controller 83 of the stocker apparatus 2 through the main controller 82 of the substrate treating apparatus. Upon receipt of the access request information, the controller 83 of the stocker apparatus 2 transmits access propriety information determined based on the detection signal from the sensor 73*c*, to the central controller 81 of the factory through the main controller 82 of the substrate treating apparatus. The central controller 81 of the factory gives instructions based on the access propriety information to the transport controller 84 of the external transport device 40. On these instructions the external transport device 40 accesses the transfer position.

<Interlock Mechanism 70D>

Figure 16A:
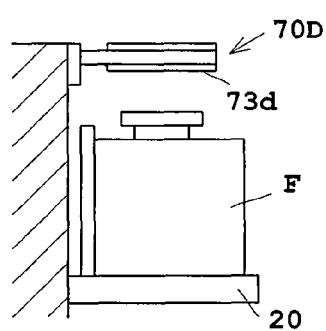
FIG. 16A is a side view of an interlock mechanism 70D according to modification (1)
Figure 16B:
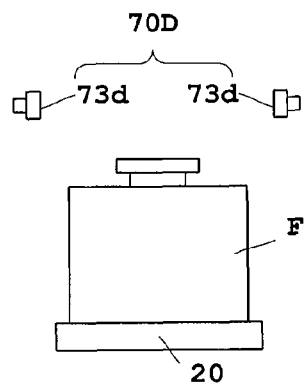
FIG. 16B is a front view of the interlock mechanism 70D according to modification (1)

FIG. 16A is a side view of an interlock mechanism 70D. FIG. 16B is a front view of the interlock mechanism 70D.

The interlock mechanism 70D includes a sensor 73*d* disposed above the transfer position for detecting the gripper 41 of the external transport device 40 entering from above.

When the sensor 73*d* detects entry, that is when the gripper 41 of the external transport device 40 is present in the transfer position, the controller 83 of the stocker apparatus 2 prohibits access of the gripper 31 of the transport mechanism 30 to the transfer position.

Communication of information is carried out when the external transport device 40 accesses the transfer position, as described in relation to the interlock mechanism 70C.

<Interlock Mechanism 70E>

Figure 17:
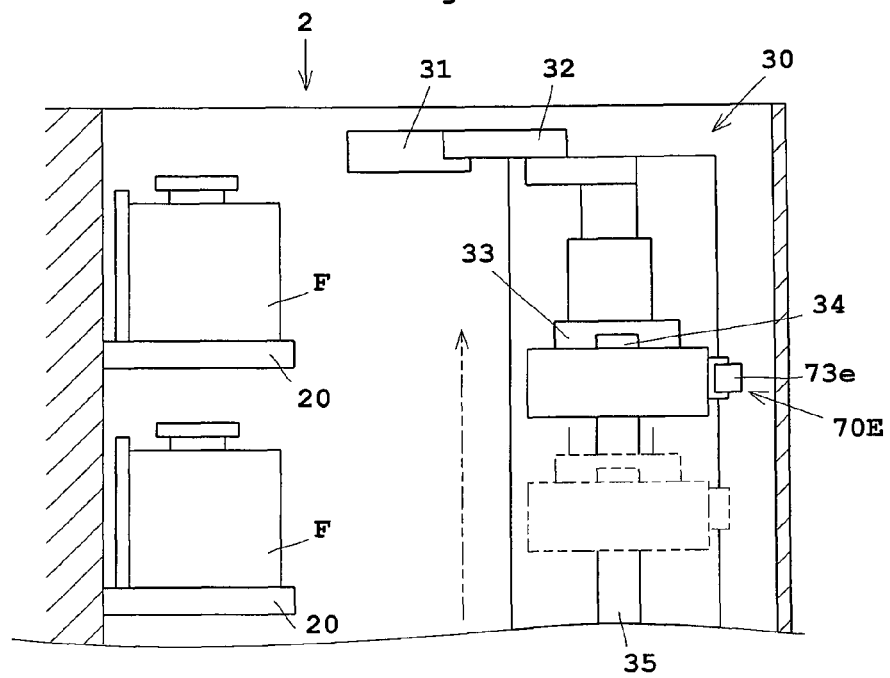
FIG. 17 is a view showing an interlock mechanism 70E according to modification (1)

FIG. 17 is a view showing an interlock mechanism 70E.

The interlock mechanism 70E includes a sensor 73*e* for monitoring coordinates, which is attached to the second moving mechanisms 35 for moving the transport mechanism 30 in vertical (Z-axis) directions.

This sensor 73*e* is arranged to detect the first moving mechanism 34 of the transport mechanism 30 at a height corresponding to the transfer position. When the sensor 73*e* detects it, that is when the position in the vertical (Z-axis) direction of the first moving mechanism 34 of the transport mechanism 30 is at a height for accessing the transfer position, the controller 83 of the stocker apparatus 2 prohibits the external transport device 40 from accessing the transfer position of the stocker apparatus 2. When the sensor 73*e* makes no detection, that is when the position in the vertical (Z-axis) direction of the first moving mechanism 34 of the transport mechanism 30 is not at the height for accessing the transfer position, the controller 83 of the stocker apparatus 2 permits the external transport device 40 to access the transfer position of the stocker apparatus 2.

Communication of information is carried out when the external transport device 40 accesses the transfer position, as described in relation to the interlock mechanism 70C.

Figure 18:
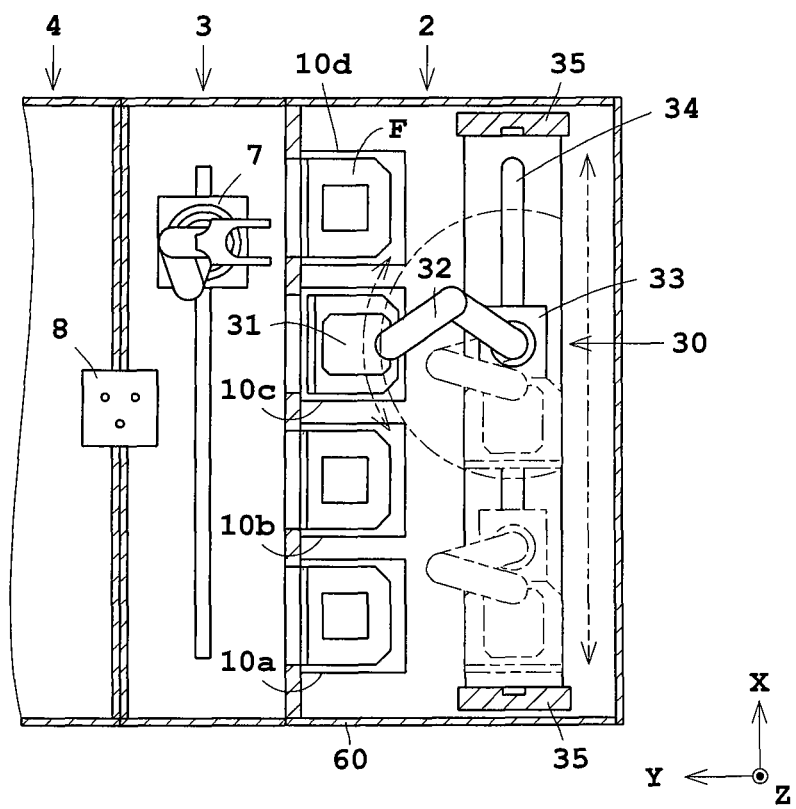
FIG. 18 is a cross section of a stocker apparatus according to modification (2)

(2) Stocker Apparatus 2 Having Transport Mechanism 30 Which Transports FOUPs F as Supported in Position Directly above Horizontal Transport Path (First Moving Mechanism 34) of Transport Mechanism 30:

In the foregoing embodiment, as shown in FIGS. 3 through 5, the stocker apparatus 2 has the space SP1 between the transport mechanism 30 and racks 20 for allowing passage of FOUPs F, whereby the transport mechanism 30 can freely move FOUPs F in the directions of XZ plane. However, the provision of space SP1 results in an increased length of the stocker apparatus 2 (the length in the direction of Y-axis). Compared with this, as shown in FIG. 18, the transport mechanism 30 may be constructed rotatable after drawing FOUP F close thereto, to support it in a position directly above the first moving mechanism 34 of the transport mechanism 30, and then to move on the XZ plane to transport the FOUP F. This construction can dispense with the above space SP1. Consequently, the size in the longitudinal (Y-axis) direction of the stocker apparatus 2 (substrate treating apparatus) can be reduced to inhibit enlargement of the apparatus.

(3) Stocker Apparatus 2 Having Load Port 12 in Position Opposed to Openers 10 across Transport Mechanism 30:

In the foregoing embodiment, the stocker apparatus 2 transfers FOUPs F to and from the external transport device 40 through the incoming rack 21 or outgoing rack 22. However, as shown in FIG. 19, a load port 12 may be provided in a position opposed to the openers 10 across the transport mechanism 30 for receiving FOUPs F, and through this load port 12 FOUPs F may be transferred to and from the external transport device 40 or people (workers).

Figure 19:
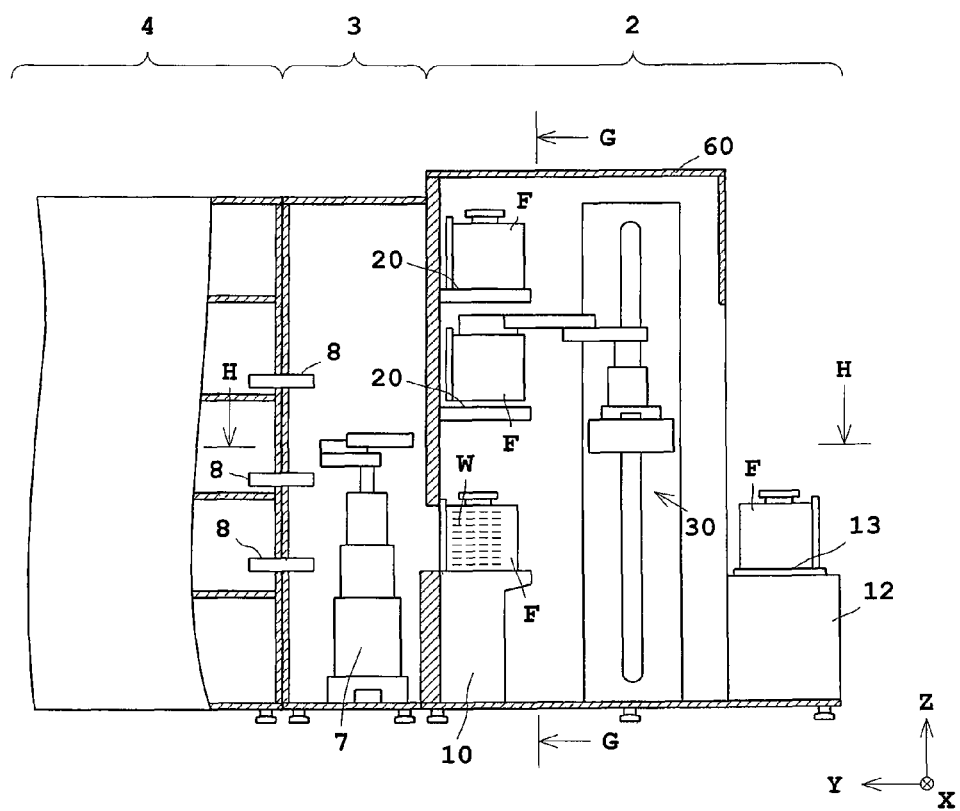
FIG. 19 is a side view in vertical section of a stocker apparatus according to modification (3)
Figure 20A:
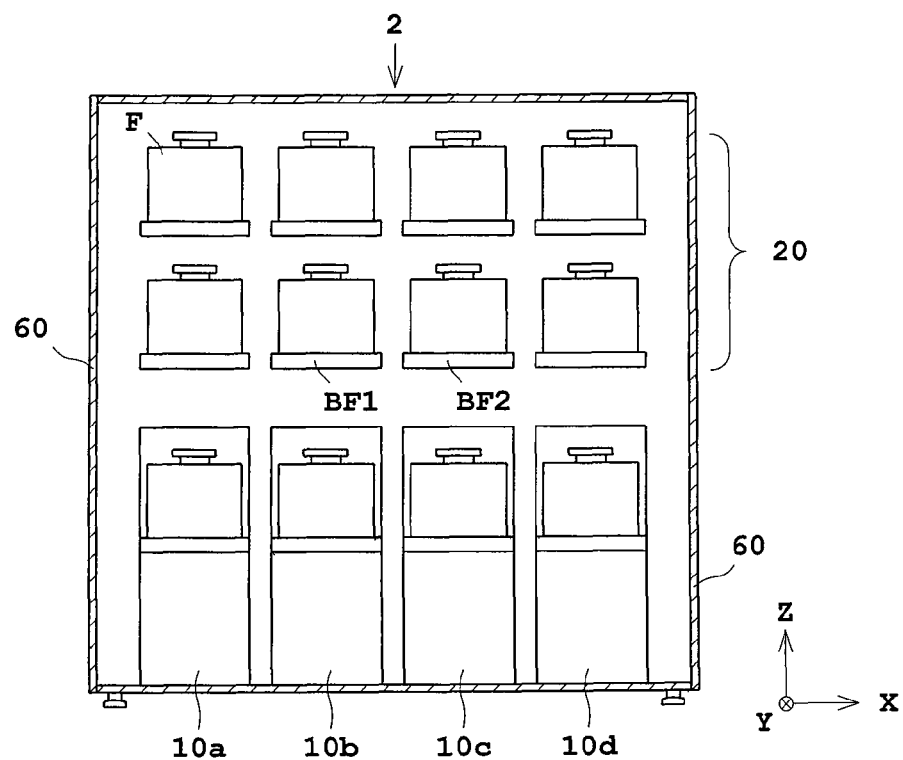
FIG. 20A is a section taken on line G-G in FIG. 19 of the stocker apparatus according to modification (3)
Figure 20B:
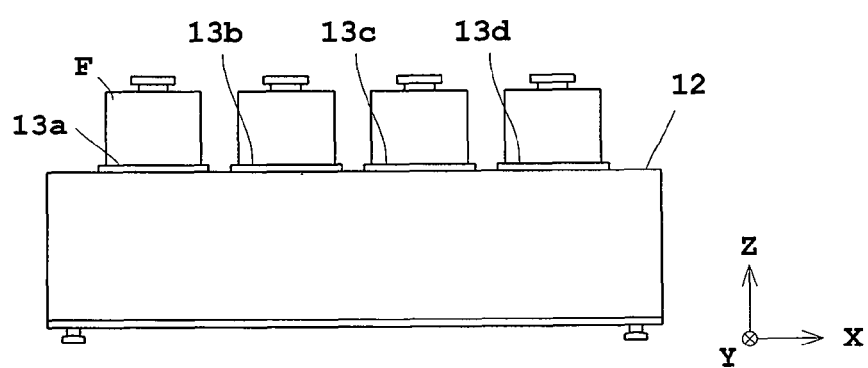
FIG. 20B a front view showing a load port portion of the stocker apparatus according to modification (3)
Figure 21:
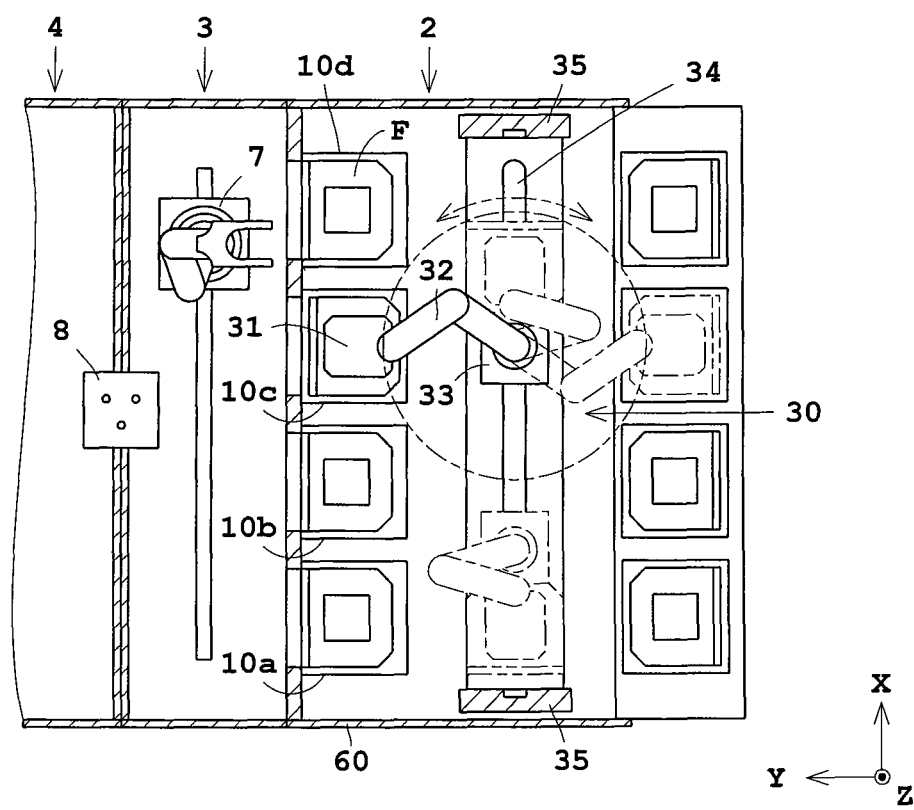
FIG. 21 is a section taken on line H-H in FIG. 19 of the stocker apparatus according to modification (3)

FIG. 19 is a side view in vertical section of the stocker apparatus 2. FIG. 20A is a section taken on line G-G of FIG. 19. FIG. 20B is a front view showing a portion including the load port 12. FIG. 21 is a section taken on line H-H of FIG. 19.

As shown in FIG. 20B, the load port 12 for receiving FOUPs F has four load port trays 13a-13d for placing FOUPs F in predetermined positions. The term load port tray(s) 13 will be used hereinafter where the load port trays 13a-13d are not distinguished. The load port trays 13 are used separately as incoming load port trays 13a and 13b where FOUPs F storing wafers W to be treated are placed, and outgoing load port trays 13c and 13d where FOUPs F storing treated wafers W are placed.

In the above description, the load port 12 has four load port trays 13. However, the number of load port trays 13 may be two or three.

In the above description, the four load port trays 13 of the load port 12 are used separately as two incoming load port trays 13 and two outgoing load port trays 13. However, these trays 13 may be used as three incoming load port trays 13 and one outgoing load port tray 13. They may be used as one incoming load port tray 13 and three outgoing load port trays 13.

In this modification, the stocker apparatus 2 newly includes the load port 12. Therefore, the rack 20 used as incoming rack 21 or outgoing rack 22 in the foregoing embodiment (FIG. 4) may be used, as appropriate, as pre-treatment storage rack BFB for keeping FOUP F storing wafers W to be treated, as mid-treatment storage rack BF for keeping empty FOUP F, or as post-treatment storage rack BFA for keeping FOUP F storing treated wafers W.

As shown in FIG. 21, the gripper 31 of the transport mechanism 30 grips FOUPs F placed on the load port trays 13 of the load port 12, and transports them to the openers 10 or racks 20. At this time, the transport mechanism 30 rotates after drawing each FOUP F close thereto, to support it in a position directly above the first moving mechanism 34 of the transport mechanism 30, and then moves on the XZ plane to transport the FOUP.

Figure 22:
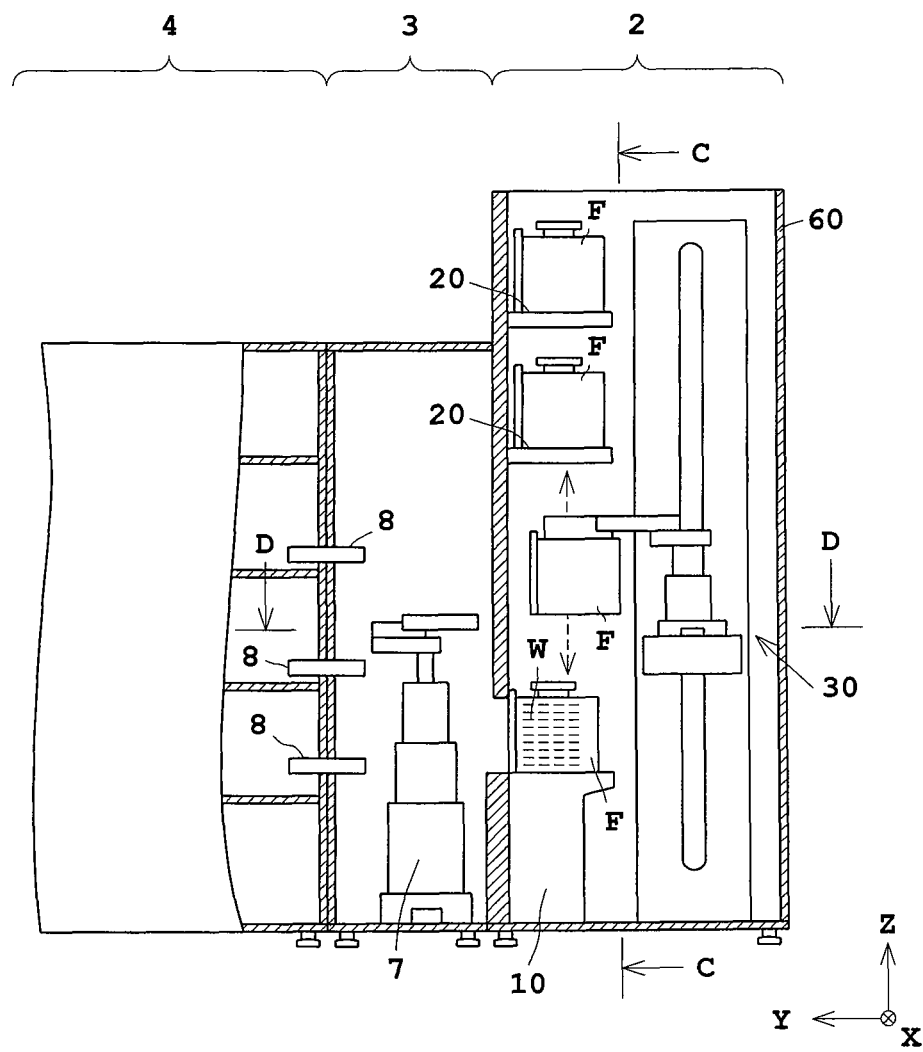
FIG. 22 is a side view in vertical section of a stocker apparatus according to modification (4)
Figure 23:
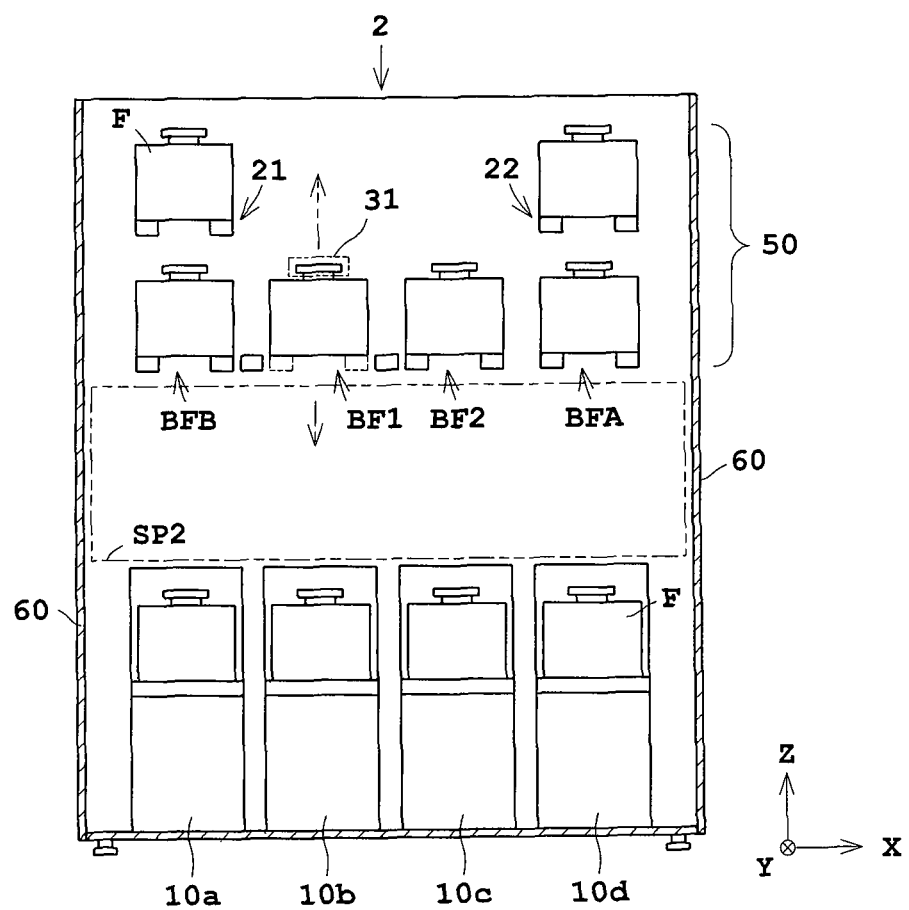
FIG. 23 is a section taken on line C-C in FIG. 22 of the stocker apparatus according to modification (4)
Figure 24:
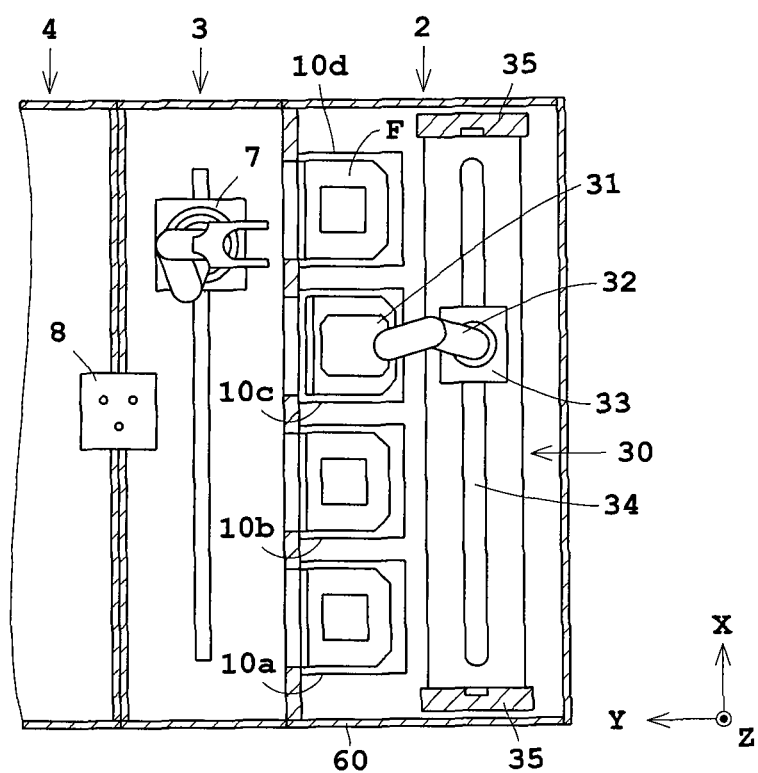
FIG. 24 is a section taken on line D-D in FIG. 22 of the stocker apparatus according to modification (4)

(4) Stocker Apparatus 2 Having Racks 50 Each with an Open/Close Mechanism Which Opens and Closes Rack 50 Horizontally Right and Left:

In the foregoing embodiment, as shown in FIGS. 3 through 5, the stocker apparatus 2 allows the transport mechanism 30 to move FOUPs F through the space SP1 between the transport mechanism 30 and racks 20, whereby FOUPs F can move freely in the directions of XZ plane. However, as shown in FIGS. 22 through 24, the stocker apparatus 2 may have racks 50 each with a mechanism which opens and closes the rack 50 horizontally right and left. With this construction, each rack 50 holds FOUP F when closed, and allows the FOUP to be moved in the vertical (Z-axis) direction in that position when open. By providing a space SP2 between the racks 50 and openers 10a-10d, FOUPs F can be moved in the transverse (X-axis) direction, and thus are movable in the XZ plane.

FIG. 22 is a side view in vertical section of the stocker apparatus 2. FIG. 23 is a section taken on line C-C FIG. 22. FIG. 24 is a section taken on line D-D of FIG. 22.

Figure 25:
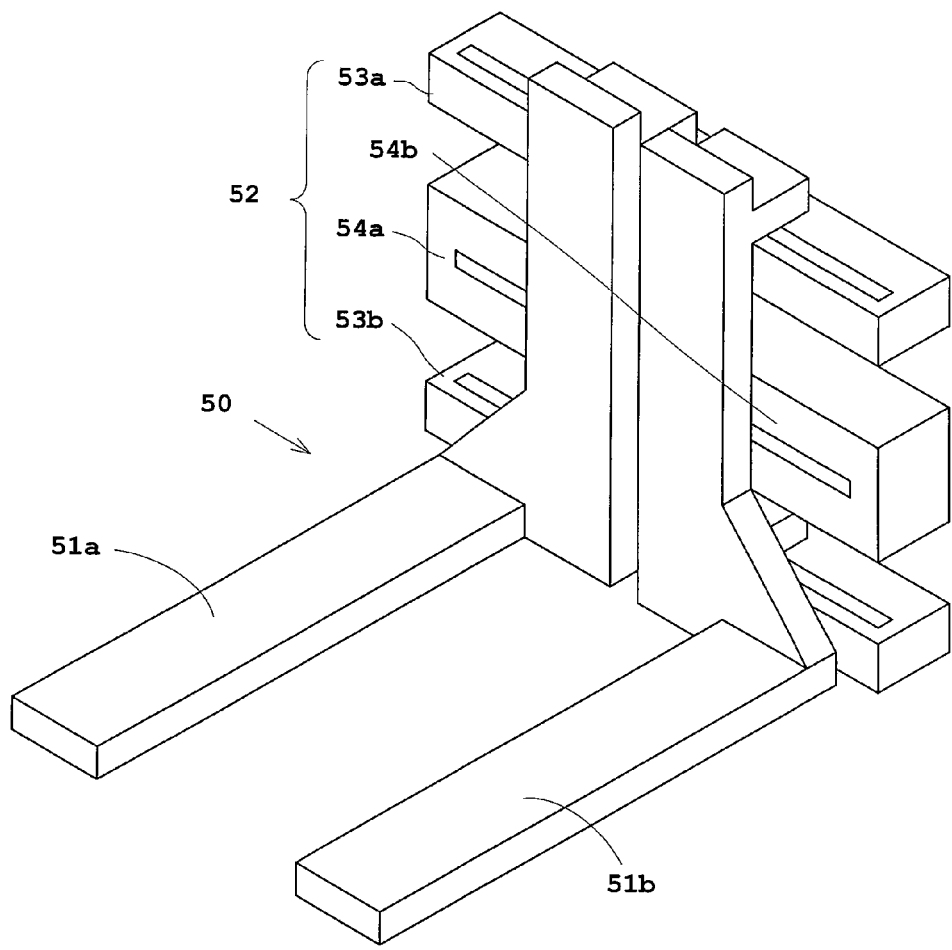
FIG. 25 is a perspective view showing a rack horizontally openable and closable right and left of the stocker apparatus according to modification (4)

As shown in FIG. 25, each rack 50 includes a pair of rack bodies 51a and 51b for supporting FOUP F, and a rack open/close mechanism 52 for opening and closing these rack bodies 51a and 51b horizontally right and left. The rack open/close mechanism 52 has a pair of support rails 53a and 53b interconnecting and supporting the rack bodies 51a and 51b, and a pair of electric motors 54a and 54b connected to the rack bodies 51a and 51b to carry out opening and closing operations.

The rack bodies 51a and 51b are freely movable on the support rails 53a and 53b, and are opened and closed by the electric motors 54a and 54b.

Figure 26A:
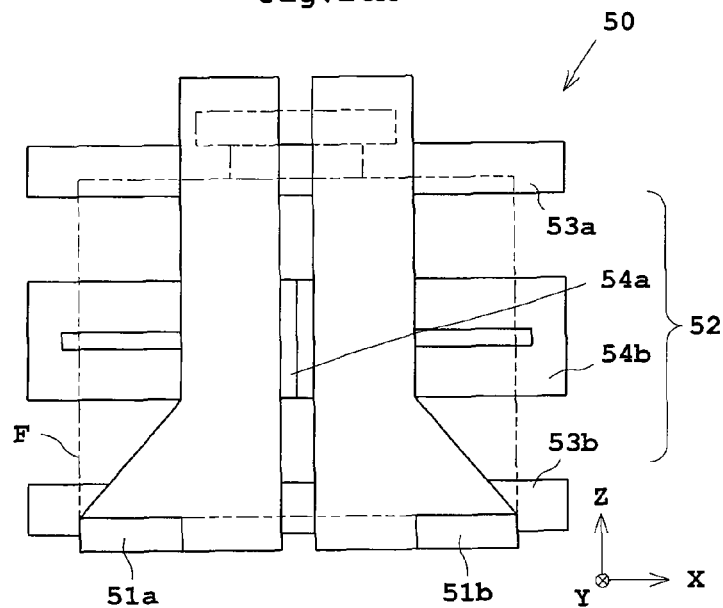
FIG. 26A is a front view showing a closed state of the rack horizontally openable and closable right and left of the stocker apparatus according to modification (4)
Figure 26B:
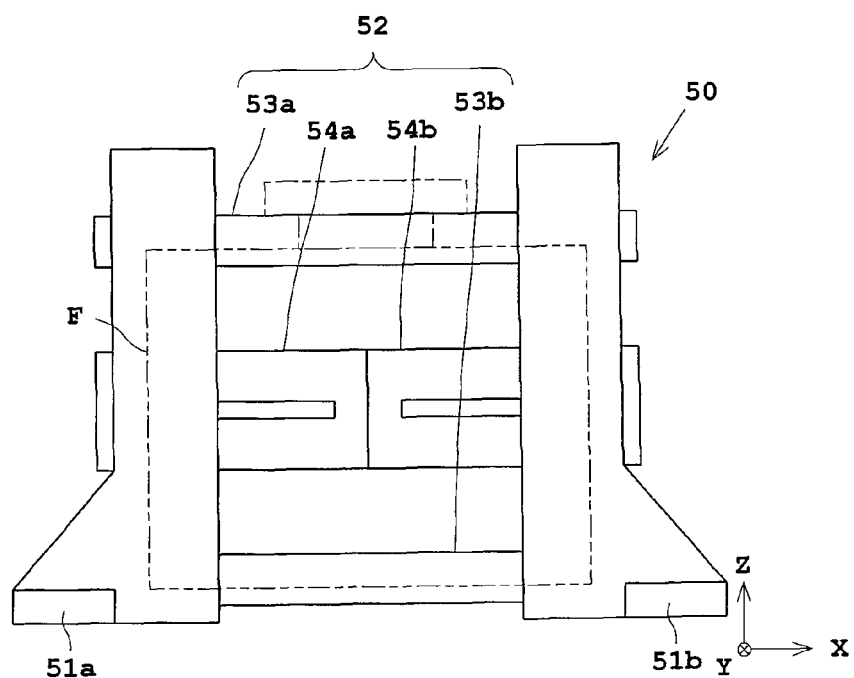
FIG. 26B is a front view showing an opened state of the rack horizontally openable and closable right and left of the stocker apparatus according to modification (4)

FIG. 26A is a front view showing a closed state of the rack 50 horizontally openable and closable right and left shown in FIG. 25. FIG. 26B is a front view showing an opened state of the rack 50 horizontally openable and closable right and left shown in FIG. 25. In the closed state, as shown in FIG. 26A, FOUP F shown in a two-dot chain line can be placed on the rack bodies 51a and 51b of the rack 50. In the open state, as shown in FIG. 26B, FOUP F shown in a two-dot chain line can be moved up and down between the rack bodies 51a and 51b of the rack 50.

The portions of the rack bodies 51a and 51b supporting FOUP F are located outward of the portions connected to the support rails 53a and 53b of the rack bodies 51a and 51b. This reduces the size in the transverse direction.

Thus, the gripper 31 of the transport mechanism 30, after gripping the FOUP F to be transported, can move the FOUP F in the vertical (Z-axis) direction in the position the FOUP F has been placed, by operating the rack open/close mechanism 52 to open the rack 50. This construction can dispense with the space SP1 (FIG. 3) for allowing passage of FOUPs F in the foregoing embodiment. Consequently, the size in the longitudinal (Y-axis) direction can be reduced. Enlargement of the apparatus can be inhibited.

Figure 27:
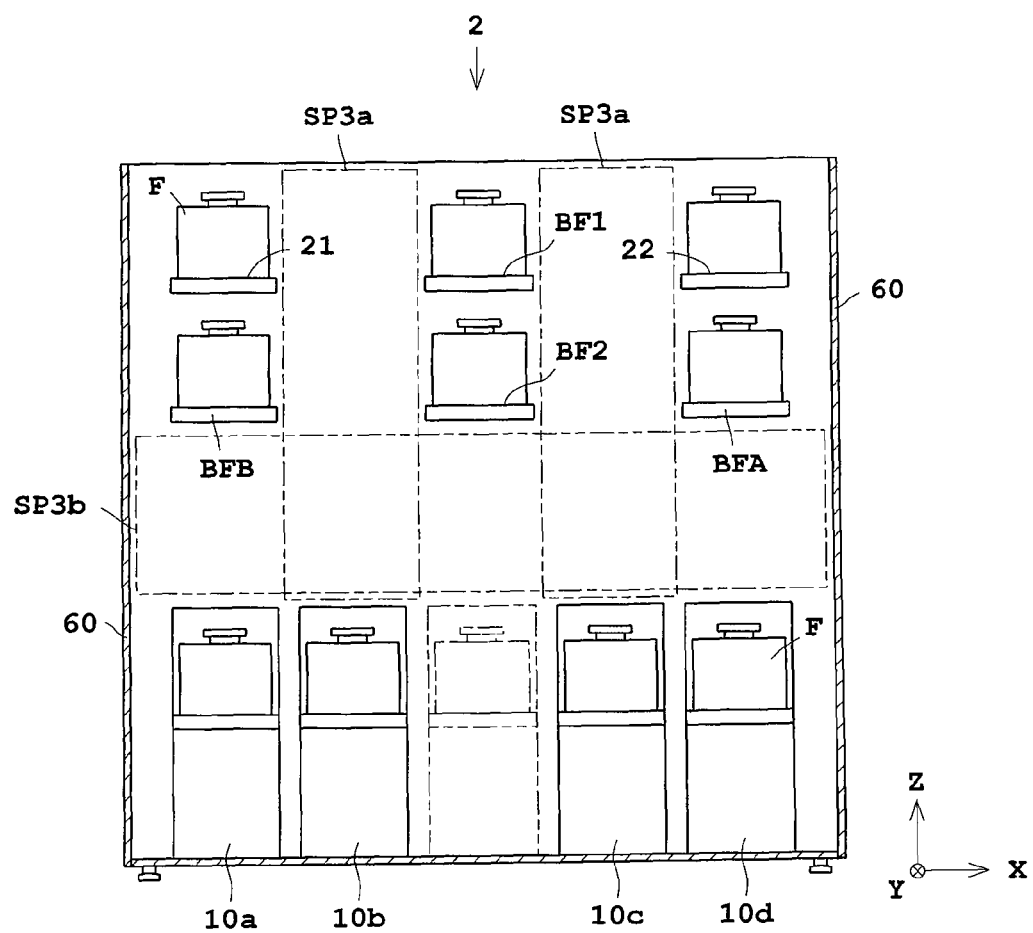
FIG. 27 is a front view in vertical section of a stocker apparatus according to modification (5)

(5) Stocker Apparatus 2 having Space SP3a between Two Racks 20 Juxtaposed in the Transverse Direction for Allowing FOUPs F to Move in the Vertical (Z-Axis) Direction:

A modified embodiment will be described, which can dispense with the FOUP moving space SP1 in the embodiment shown in FIG. 3, to shorten the apparatus in the longitudinal (Y-axis) direction FIG. 27 is a sectional front view of the stocker apparatus 2. FIG. 28 is a cross section of the transport mechanism area of the stocker apparatus 2 (a side view in vertical section of the stocker apparatus 2 is the same as that of FIG. 22).

As shown in FIG. 27, the stocker apparatus 2 has a space SP3a between two racks 20 juxtaposed in the transverse direction for allowing FOUPs F to move in the vertical (Z-axis) direction. The stocker apparatus 2 has also a space SP3b between the racks 20 and openers 10 for allowing FOUPs F to move in the transverse (X-axis) direction. When moving FOUPs F, the transport mechanism 30 moves, for example, FOUP F placed on the incoming rack 21 horizontally and slightly rightward in FIG. 27, and places the FOUP F in the space SP3a. Then, the FOUP F is lowered within the space SP3a into the space SP3b. Further, the FOUP F is moved within the space SP3b leftward in FIG. 27, and is placed on the opener 10a.

According to this construction, even where the racks 20 are not provided with the mechanisms for opening and closing horizontally right and left as in the foregoing modification (4), the size in the longitudinal (Y-axis) direction can be reduced and enlargement of the apparatus can be inhibited.

As shown in FIG. 28, this construction requires a width corresponding to five openers 10, thereby increasing the size in the transverse (X-axis) direction. However, the stocker apparatus 2 may have a fifth opener 10 as shown in two-dot chain lines in FIG. 27. Consequently, the apparatus may be used in the manner of operation described in the embodiment of this invention, or five openers 10 may be adopted as in the conventional method. In this case, the racks 20 other than the incoming rack 21 and outgoing rack 22 may be used as pre-treatment storage racks BFB and post-treatment storage racks BFA.

(6) Arrangement of Pre-Treatment Storage Rack BFB, Mid-Treatment Storage Racks BF and Post-Treatment Storage Rack BFA of Stocker Apparatus 2:

In the foregoing embodiment, the stocker apparatus 2 has the pre-treatment storage rack BFB, mid-treatment storage racks BF and post-treatment storage rack BFA whose specific positional relationships are not particularly defined. However, the pre-treatment storage rack BFB may be disposed closer to the incoming rack 21 than the other racks such as the mid-treatment storage racks BF. Similarly, the post-treatment storage rack BFA may be disposed closer to the outgoing rack 22 than the other racks such as the mid-treatment storage racks BF. The mid-treatment storage racks BF may be arranged closer to positions between the feed-only openers 10 and collect-only openers 10 than the other racks BFB and BFA. Such arrangement will realize FOUP transport with improved efficiency.

(7) Numbers of Pre-Treatment Storage Racks BFB, Mid-Treatment Storage Racks BF1 and BF2 and Post-Treatment Storage Racks BFA of the Stocker Apparatus 2:

In the foregoing embodiment, the stocker apparatus 2 has one pre-treatment storage rack BFB, two mid-treatment storage racks BF and one post-treatment storage rack BFA. However, this construction is not limitative. For example, the stocker apparatus 2 may have two pre-treatment storage racks BFB, three mid-treatment storage racks BF and two post-treatment storage racks BFA. The stocker apparatus 2 may have three pre-treatment storage racks BFB, two mid-treatment storage racks BF and four post-treatment storage racks BFA.

(8) The Feed-Only Openers and Collect-Only Openers of Stocker Apparatus 2:

In the foregoing embodiment, the four openers 10a-10d have different roles to play, such that the two left openers 10a and 10b are used only for feeding wafers W, and the two right openers 10c and 10d only for collecting wafers W. However, this construction is not limitative. The two right openers 10c and 10d may be used only for feeding wafers W, and the two left openers 10a and 10b only for collecting wafers W.

This invention may be embodied in other specific forms without departing from the spirit or essential attributes thereof and, accordingly, reference should be made to the appended claims, rather than to the foregoing specification, as indicating the scope of the invention.

What is claimed is:

1. A method of controlling a stocker apparatus connected to a single substrate type substrate treating apparatus main body, for improved handling of empty FOUPs, the stocker apparatus having:

openers for receiving FOUPs acting as containers each for storing a plurality of substrates, to feed and collect the substrates to and from the single substrate type substrate treating apparatus main body for performing a predetermined treatment of substrates, the openers including a feed-only opener for feeding the substrates, and a collect-only opener for collecting the substrates, a transport mechanism for holding and transporting the FOUPs, a control device for controlling at least the FOUP transport mechanism, and racks arranged above the openers for receiving the FOUPs, the racks including an incoming rack for receiving the FOUPs from an external transport device, an outgoing rack for delivering the FOUPs to the external transport device, and a mid-treatment storage rack for keeping an empty FOUP after the substrates are fed therefrom, said method comprising using the control device for controlling the transport mechanism, wherein:

when the substrates have been emptied from a FOUP at the feed-only opener, then the transport mechanism transports the empty FOUP from the feed-only opener to the collect-only opener, only when no FOUP is present on the collect-only opener, and when the empty FOUP is not transported to the collect-only opener because of a FOUP present on the collect-only opener, the transport mechanism transports the empty FOUP to the mid-treatment storage rack; and then transports the empty FOUP to the collect-only opener from the mid-treatment storage rack when the collect-only opener has become vacant, and after the transport mechanism has transported the empty FOUP to the collect-only opener, the treated substrates are then collected back into the FOUP.

2. The method of controlling the stocker apparatus according to claim 1, wherein the racks further include a pre-treatment storage rack for keeping a FOUP storing substrates to be treated, the method further comprising the control device controlling the transport mechanism, wherein:

the transport mechanism transports the FOUP storing the substrates to be treated and placed on the incoming rack to the feed-only opener only when no FOUP is present on the feed-only opener, and when the FOUP storing the substrates to be treated and placed on the incoming rack is unable to be transported to the feed-only opener because of a FOUP present on the feed-only opener, the transport mechanism transports the FOUP storing the substrates to be treated and placed on the incoming rack to the pre-treatment storage rack; and then transports to the feed-only opener the FOUP storing the substrates to be treated and transported to the pre-treatment storage rack, when the feed-only opener is vacant.

3. The method of controlling the stocker apparatus according to claim 2, wherein:

the step of transporting the FOUP storing the substrates to be treated and placed on the incoming rack to one of the feed-only opener and the pre-treatment storage rack is executed to determine whether a different FOUP is present on the feed-only opener; and the step of transporting to the feed-only opener the FOUP storing the substrates to be treated and transported to the pre-treatment storage rack is executed to determine whether the feed-only opener is vacant.

4. The method of controlling the stocker apparatus according to claim 2, wherein the FOUP storing the substrates to be treated and placed on the incoming rack, when unable to be transported to the feed-only opener, is transported directly to the pre-treatment storage rack among the outgoing rack, the pre-treatment storage rack, the mid-treatment storage rack and the collect-only opener.

5. The method of controlling the stocker apparatus according to claim 2, wherein the racks further include a post-treatment storage rack for keeping a FOUP having collected treated substrates, the method further comprising:
 transporting the FOUP having collected the treated substrates and placed on the collect-only opener to the outgoing rack when no FOUP is present on the outgoing rack, and transporting the FOUP having collected the treated substrates to the post-treatment storage rack when the FOUP having collected the treated substrates is unable to be transported to the outgoing rack because of a different FOUP present on the outgoing rack; and
 transporting to the outgoing rack the FOUP having collected the treated substrates and transported to the post-treatment storage rack when the outgoing rack is vacant after the FOUP having collected the treated substrates is transported to the post-treatment storage rack.

6. The method of controlling the stocker apparatus according to claim 5, wherein:
 the step of transporting the empty FOUP on the feed-only opener to one of the collect-only opener and the mid-treatment storage rack is executed to determine whether a different FOUP is present on the collect-only opener;
 the step of transporting to the collect-only opener the empty FOUP transported to the mid-treatment storage rack is executed to determine whether the collect-only opener is vacant;
 the step of transporting the FOUP storing the substrates to be treated and placed on the incoming rack to one of the feed-only opener and the pre-treatment storage rack is executed to determine whether a different FOUP is present on the feed-only opener;
 the step of transporting to the feed-only opener the FOUP storing the substrates to be treated and transported to the pre-treatment storage rack is executed to determine whether the feed-only opener is vacant;
 the step of transporting the FOUP having collected the treated substrates and placed on the collect-only opener to one of the outgoing rack and the post-treatment storage rack is executed to determine whether a different FOUP is present on the outgoing rack; and
 the step of transporting to the outgoing rack the FOUP having collected the treated substrates and transported to the post-treatment storage rack is executed to determine whether the outgoing rack is vacant.

7. The method of controlling the stocker apparatus according to claim 5, wherein:
 the empty FOUP, when unable to be transported to the collect-only opener, is transported directly to the mid-treatment storage rack among the incoming rack, the outgoing rack, the pre-treatment storage rack, the mid-treatment storage rack and the post-treatment storage rack;
 the FOUP storing the substrates to be treated and placed on the incoming rack, when unable to be transported to the feed-only opener, is transported directly to the pre-treatment storage rack among the outgoing rack, the pre-treatment storage rack, the mid-treatment storage rack, the post-treatment storage rack and the collect-only opener; and
 the FOUP having collected the treated substrates, when unable to be transported to the outgoing rack, is transported directly to the post-treatment storage rack among the incoming rack, the pre-treatment storage rack, the mid-treatment storage rack, the post-treatment storage rack and the feed-only opener.

8. The method of controlling the stocker apparatus according to claim 1, wherein the racks further include a post-treatment storage rack for keeping a FOUP having collected treated substrates, the method further comprising the control device controlling the transport mechanism, wherein:
 the transport mechanism transports the FOUP having collected the treated substrates and placed on the collect-only opener to the outgoing rack only when no FOUP is present on the outgoing rack, and
 when the FOUP having collected the treated substrates is unable to be transported to the outgoing rack because of a FOUP present on the outgoing rack, the transport mechanism transports the FOUP having collected the treated substrates to the post-treatment storage rack; and then transports to the outgoing rack the FOUP having collected the treated substrates and transported to the post-treatment storage rack, when the outgoing rack is vacant.

9. The method of controlling the stocker apparatus according to claim 8, wherein:
 the step of transporting the FOUP having collected the treated substrates and placed on the collect-only opener to one of the outgoing rack and the post-treatment storage rack is executed to determine whether a different FOUP is present on the outgoing rack; and
 the step of transporting to the outgoing rack the FOUP having collected the treated substrates and transported to the post-treatment storage rack is executed to determine whether the outgoing rack is vacant.

10. The method of controlling the stocker apparatus according to claim 8, wherein the FOUP having collected the treated substrates, when unable to be transported to the outgoing rack, is transported directly to the post-treatment storage rack among the incoming rack, the mid-treatment storage rack, the post-treatment storage rack and the feed-only opener.

11. The method of controlling the stocker apparatus according to claim 1, wherein:
 the step of transporting the empty FOUP on the feed-only opener to one of the collect-only opener and the mid-treatment storage rack is executed to determine whether a different FOUP is present on the collect-only opener; and
 the step of transporting to the collect-only opener the empty FOUP transported to the mid-treatment storage rack is executed to determine whether the collect-only opener is vacant.

12. The method of controlling the stocker apparatus according to claim 1, wherein the empty FOUP, when unable to be transported to the collect-only opener, is transported directly to the mid-treatment storage rack among the incoming rack, the outgoing rack and the mid-treatment storage rack.

13. The method of controlling the stocker apparatus according to claim 1, wherein
 the transport mechanism transports the empty FOUP to the collect-only opener before the substrates having received a predetermined treatment with the substrate treating apparatus main body are sent out from the substrate treating apparatus main body.

14. A method of controlling a substrate treating apparatus having a single substrate type substrate treating apparatus main body for performing a predetermined treatment of substrates, and a stocker apparatus connected to the substrate treating apparatus main body, for improved handling of empty FOUPs,
 the stocker apparatus having:
 openers for receiving FOUPs acting as containers each for storing a plurality of substrates, to feed and collect the substrates to and from the single substrate type substrate treating apparatus main body, the openers including a feed-only opener for feeding the substrates, and a collect-only opener for collecting the substrates, a transport mechanism for holding and transporting the FOUPs, a control device for controlling at least the FOUP transport mechanism, and racks arranged above the openers for receiving the FOUPs, the racks including an incoming rack for receiving the FOUPs from an external transport device, an outgoing rack for delivering the FOUPs to the external transport device, and a mid-treatment storage rack for keeping an empty FOUP after the substrates are fed therefrom, said method comprising using the control device for controlling the transport mechanism, wherein:

when the substrates have been emptied from a FOUP at the feed-only opener, then the transport mechanism transports the empty FOUP from the feed-only opener to the collect-only opener, only when no FOUP is present on the collect-only opener, and when the empty FOUP is not transported to the collect-only opener because of a FOUP present on the collect-only opener, the transport mechanism transports the empty FOUP to the mid-treatment storage rack; and then transports the empty FOUP to the collect-only opener from the mid-treatment storage rack when the collect-only opener has become vacant, and after the transport mechanism has transported the empty FOUP to the collect-only opener, the treated substrates are then collected back into the FOUP.

15. The method of controlling the substrate treating apparatus according to claim 14, wherein:

the step of transporting the empty FOUP on the feed-only opener to one of the collect-only opener and the mid-treatment storage rack is executed to determine whether a different FOUP is present on the collect-only opener; and the step of transporting to the collect-only opener the empty FOUP transported to the mid-treatment storage rack is executed to determine whether the collect-only opener is vacant.

16. The method of controlling the substrate treating apparatus according to claim 14, wherein the empty FOUP, when unable to be transported to the collect-only opener, is transported directly to the mid-treatment storage rack among the incoming rack, the outgoing rack and the mid-treatment storage rack.

17. The method of controlling the substrate treating apparatus according to claim 14, wherein the transport mechanism transports the empty FOUP to the collect-only opener before the substrates having received a predetermined treatment with the substrate treating apparatus main body are sent out from the substrate treating apparatus main body.

18. The method of controlling the substrate treating apparatus according to claim 14, wherein the substrate treating apparatus main body includes an indexer mechanism configured to feed the substrates from the FOUP and collect the substrates into the empty FOUP, the control device of the substrate treating apparatus controls the transport mechanism and the indexer mechanism, and the control device controls the indexer mechanism to feed the substrate from the FOUP to the substrate treating apparatus main body, such feeding being via the feed-only opener, and to collect the substrates into the empty FOUP from the substrate treating apparatus main body, such collecting being via the collect-only opener.

19. The method of controlling the substrate treating apparatus according to claim 14, wherein the substrate treating apparatus main body includes an indexer mechanism configured to feed the substrates from the FOUP and collect the substrates into the empty FOUP, the control device of the substrate treating apparatus controls the transport mechanism and the indexer mechanism, and the control device controls the indexer mechanism so that when the substrates are to be fed from the FOUP to the substrate treating apparatus main body, they are fed via the feed-only opener, and when the substrates are to be collected into the empty FOUP from the substrate treating apparatus main body, they are collected via the collect-only opener.

* * * * *